(12) United States Patent
Cronk et al.

(10) Patent No.: US 6,795,636 B1
(45) Date of Patent: Sep. 21, 2004

(54) RADIATION-TRANSMISSIVE FILMS ON GLASS ARTICLES

(75) Inventors: Bryon James Cronk, Round Rock, TX (US); Trevor Wayne MacDougall, Simsbury, CT (US); Moses Mekala David, Woodbury, MN (US); Brian John Gates, Eagan, MN (US); Brian Kenneth Nelson, Shoreview, MN (US); James Francis Brennan, III, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/519,447

(22) Filed: Mar. 5, 2000

(51) Int. Cl.$^7$ ................................................. G02B 6/00
(52) U.S. Cl. ..................... 385/141; 385/144; 385/145; 385/129; 359/885
(58) Field of Search ................................ 385/141, 144, 385/145, 129, 130, 131, 37; 359/885

(56) References Cited

U.S. PATENT DOCUMENTS

| | | |
|---|---|---|
| 5,234,529 A | 8/1993 | Johnson |
| 5,352,493 A | 10/1994 | Dorfman et al. |
| H1461 H | 7/1995 | DiVita et al. |
| 5,466,431 A | 11/1995 | Dorfman et al. |
| 5,530,581 A | 6/1996 | Cogan |
| 5,620,495 A | 4/1997 | Aspell et al. |
| 5,718,976 A | 2/1998 | Dorfman et al. |
| 5,740,941 A | 4/1998 | Lemelson |
| 5,745,615 A * | 4/1998 | Atkins et al. ............ 385/37 |
| 5,773,486 A | 6/1998 | Chandross et al. |
| 5,912,999 A | 6/1999 | Brennan, III et al. |
| 5,948,166 A | 9/1999 | David et al. |
| 5,999,671 A | 12/1999 | Jin et al. |
| 6,015,597 A | 1/2000 | David |

FOREIGN PATENT DOCUMENTS

| | | |
|---|---|---|
| DE | 41 22 834 A1 | 1/1993 |
| DE | 41 22 834 A | 1/1993 |
| EP | 0 448 227 A1 | 9/1991 |
| EP | 0 743 375 A | 11/1996 |
| EP | 0 856 592 A | 8/1998 |
| GB | 2 105 371 A | 3/1983 |
| JP | 59 083107 A | 5/1984 |
| JP | 6-184533 | 7/1994 |
| JP | 6-299146 | 10/1994 |
| WO | WO 96 40446 A | 12/1996 |
| WO | WO 97 40207 A | 10/1997 |
| WO | WO 97 48836 A | 12/1997 |
| WO | WO 99 29477 A | 6/1999 |

OTHER PUBLICATIONS

Abstract (Bo et al, "PECVD Amorphous Diamond–Like Carbon Films Deposited at Low Substrate Temperature", Aug. 2000, Editorial Board of J. Synthetic Crystals, vol. 29, No. 3, p. 220–223.).*

Bray, D. J. et al.; "*New Family of Tailorable Thin–Film Coatings*", Advanced Materials & Processes, Metals Park, Ohio, vol. 146, No. 6, pp. 31–34.

Lettington, A.H., "*Application of Diamond–like Carbon Thin Films*", Carbon, US, Elsevier Science Publishing, NY, vol. 36, No. 5–6, 1998, pp. 555–560.

* cited by examiner

*Primary Examiner*—Akm Enayet Ullah
*Assistant Examiner*—Sung Pak
(74) *Attorney, Agent, or Firm*—Melanie G. Gover; Sean J. Edman

(57) ABSTRACT

A glass article comprising a glass substrate and a diamond-like film deposited on the substrate is disclosed. The glass article is desirably responsive to actinic radiation, such as being capable of demonstrating a change in refractive index upon exposure to actinic radiation. The film permits passage of the actinic radiation. through the film and into the substrate. In specific implementations, the film comprises at least about 30 atomic percent carbon, from about 0 to about 50 atomic percent silicon, and from about 0 to about 50 atomic percent oxygen on a hydrogen-free basis.

17 Claims, 16 Drawing Sheets

RADIATION-TRANSMISSIVE FILMS ON GLASS ARTICLES

TECHNICAL FIELD

The present invention relates to diamond-like films, articles containing diamond-like films, methods of making diamond-like films, and apparatus for depositing diamond-like films.

BACKGROUND

In recent years, materials have been developed that demonstrate a change in their optical properties on exposure to specific types of radiation. For example, some glass materials demonstrate a change in their refractive index after exposure to actinic radiation. Doping of glass fibers with germanium is one way to make them responsive to actinic radiation so that their localized refractive index can be changed.

The ability to change the optical properties of these materials, and in particular their refractive indices, has become important in numerous applications. One such application is creating gratings in optical fibers, which are regions in an optical fiber having periodic or quasi-periodic variations in refractive index. These fiber gratings can sometimes be thought of as a series of adjacent parallel planes of alternating higher and lower refractive index. Gratings have a number of important applications, including use as very narrowband retroreflectors suitable for providing feedback at a specific wavelength in fiber lasers (both in short pulse and single frequency lasers), as gain flattening devices in optical amplifiers, and as filters for multichannel wavelength-division multiplexed (WDM) communications systems.

Gratings are generally classified into two groups, long period and short period (or Bragg) gratings. Long period gratings scatter light into forward propagating cladding modes. Bragg gratings reflect light into counter propagating core (or cladding) modes.

If the spacing of the grating planes is varied across the length of the grating it is possible to produce a chirped grating, in which different wavelengths can be considered to be reflected from different points along the grating. Such gratings can be used to provide light dispersion, either to compensate for fiber dispersion in fiber links, or to manipulate optical pulses, as in a chirped pulse amplification (CPA) system.

During manufacture of optical glass fibers, the glass fibers are traditionally coated with a polymeric material to protect and maintain the intrinsic strength of the fiber during handling. The term "coating" generally refers to a material that is first applied to a solid substrate in a liquid state, then solidified by UV radiation (photopolymerizable), heat (thermoset), or by removing solvent molecules from the coating solution. In order to make a quality Bragg grating in these fibers it is usually necessary to remove the protective coating. The coating is normally removed by an acid bath. This is followed by formation of the grating and application of a new coating. This multi-step method of removing the coating, modifying the fiber, and then recoating the fiber can be time consuming, expensive and may result in a reduction in the strength of the fiber.

These steps are necessary for most applications because the gratings can not normally be formed through the coatings covering the fiber. Gratings cannot normally be formed through coatings for a number of reasons. First, the coatings often have a variable thickness, and this variable thickness can create a distorting lens that alters the path of the actinic radiation, resulting in a less precisely formed grating. Any lack of homogeneity, surface irregularities, or other optical imperfections can also degrade the quality of Bragg gratings written through such coatings. Second, although some coatings are highly transparent, they still often partially absorb the actinic radiation and overheat or are degraded by the high doses of radiation energy typically needed to form Bragg gratings in photosensitive glasses. In some circumstances, irradiation can actually result in the coating being degraded (such as by being charred) or ablated from the fiber.

SUMMARY OF THE INVENTION

A need exists for an improved protective layer for application to substrates, including substrates that may be altered by actinic radiation. The layer of material should preferably protect and retain the initial strength of the substrate, particularly when the substrate is an optical glass fiber. The protective layer should also allow passage of actinic radiation into the substrate, such as actinic radiation into optical glass fiber. In addition, it is desirable that the protective layer be such that it can be applied in a substantially uniform layer in order to control the distortion and refraction of the actinic radiation as it is directed into the substrate.

The present invention is directed to articles having a diamond-like film, methods of making the articles, and apparatus for making the articles. In specific implementations, the articles include a glass substrate with a layer of a diamond-like film. The glass substrate is optionally capable of demonstrating a change in physical properties such as refractive index upon exposure to actinic radiation, and the diamond-like film is a substantially amorphous film that allows passage of actinic radiation into the glass substrate. In this manner, the diamond-like film is "write-through" because it allows passage of the radiation into the substrate in order to generate changes in the substrate properties (such as the refractive index).

The diamond-like film is suitable, for example, for deposit on glass fibers, including optical glass fibers used to transmit data. The film provides protection for the glass fiber substrates and avoids lowering of the fibers' strength below acceptable levels during handling in the writing process. In most applications, the film enhances the strength of the fibers relative to uncoated fibers subjected to the same writing and handling conditions. In addition, the film can be formed on the substrate in a highly uniform manner that provides improved optical and physical properties for the finished article.

The articles made in accordance with the present invention include articles suitable for use in making Bragg gratings. The write-through characteristics of the film, along with its generally uniform thickness, allow for the formation of high quality Bragg gratings that can be formed quickly and with great precision. In addition, the methods of making Bragg gratings in accordance with the invention permit the strength of the fibers to be substantially preserved, and even enhanced, compared to fibers that have not been modified in accordance with the invention.

In order to provide an adequate film for write through applications the diamond-like film preferably allows transmission of radiation without degradation of the film. If any degradation does occur in the film, it is preferred that the degradation is insufficient to cause diminished strength properties of the substrate. The film preferably remains deposited on the substrate and is still able to be written through after exposure to light from a frequency doubled Argon laser operating at writing beam power densities of 4000 W/cm$^2$ at a wavelength of 244 nm for one hour. A frequency doubled Argon laser is a continuous laser based on a laser cavity containing ionized argon gas and a crystal that doubles the frequency and changes the wavelength of output radiation for example from 488 nm to 244 nm.

Various diamond-like films are suitable for the present invention, including diamond-like films selected from the group including diamond-like carbon, diamond-like glass, diamond-like networks, and interpenetrating diamond-like nanocomposites. In specific implementgations of the invention the diamond-like film has on a hydrogen-free basis at least 30 atomic percent carbon, from 0 to 50 atomic percent silicon, and from 0 to 50 atomic percent oxygen. The diamond-like film typically includes on a hydrogen-free basis at least 25 atomic percent carbon, from 0 to 50 atomic percent silicon, and from 0 to 50 atomic percent oxygen; and in certain implementations the film include from about 30 to about 100 atomic percent carbon, from about 20 to about 40 atomic percent silicon, and from about about 30 to about 40 atomic percent oxygen. In specific advantageous implementations the diamond-like film includes from 30 to about 36 atomic percent carbon, from 26 to 32 atomic percent silicon, and from 35 to 41 atomic percent oxygen on a hydrogen free basis. "Hydrogen-free basis" refers to the atomic composition of a material as established by a method such as Electron Spectroscopy for Chemical Analysis (ESCA), which does not detect hydrogen even if large amounts are present in the thin films.

Thin films made in accordance with the invention may have a variety of light transmissive properties. Thus, depending upon the application, the thin films may have increased transmissive properties at various frequencies. However, in specific implementations the thin film is at least 50 percent transmissive to radiation at one or more wavelength from about 180 to about 800 nanometers. In particular, the thin film should be transmissive to light at the wavelength of the actinic radiation used to alter the refractive index or other properties of the substrate. In other advantageous implementations the film is transmissive to greater than 70 percent (and more advantageously greater than 90 percent) of radiation at one or more wavelengths from about 180 to about 800 nanometers. High transmissivity is typically preferred because it allows thicker films to be produced without significant reduction in radiation intensity passing through the film. Thus, although the present invention is suitable for lower transmissivity, particularly desirable levels are greater than 50 percent.

The invention is further directed to a method of depositing a diamond-like film onto a substrate, including the deposit of a write-through diamond-like film onto a glass substrate. The method includes providing a capacitively coupled reactor system having two electrodes in an evacuable reaction chamber. The chamber is partially evacuated, and radio frequency power is applied to one of the electrodes. A carbon-containing source is introduced between the electrodes to form a plasma including reactive species in proximity to the electrodes, and to also form an ion sheath proximate at least one electrode. The glass substrate is placed within the ion sheath and exposed to the reactive species to form a diamond-like thin film on the substrate. The conditions can result in a thin film that includes, for example, a diamond-like film including on a hydrogen-free basis at least 25 atomic percent carbon, from 0 to 50 atomic percent silicon, and from 0 to 50 atomic percent oxygen. The thin film can be made to a specific thickness, typically from 1 to 10 microns.

As used herein, the term "diamond-like film" refers to substantially or completely amorphous films included of carbon, and optionally including one or more additional components selected from the group including hydrogen, nitrogen, oxygen, fluorine, silicon, sulfur, titanium, and copper. Other elements may be present in certain embodiments. The films may be covalently bonded in a random system or in an interpenetrating system, such as in an interpenetrating diamond-like nanocomposite (called DYLYN), as described, e.g., U.S. Pat. No. 5,466,431. The amorphous diamond-like films of this invention may contain clustering of atoms that give it a short-range order but are essentially void of medium and long range ordering that lead to micro or macro crystallinity which can adversely scatter actinic radiation having wavelengths of from 180 nm to 800 nm.

As used herein, the term "parallel plate reactor" means a reactor containing at least two electrodes, wherein the primary mechanism for current flow between the electrodes is capacitive coupling. The electrodes may be asymmetric, meaning that they may be of different size, shape, surface area, etc. and need not necessarily be parallel to each other. One electrode may be grounded, and one electrode may be the reaction chamber itself.

As used herein, the term "amorphous" means a substantially randomly-ordered non-crystalline material having no x-ray diffraction peaks or modest x-ray diffraction peaks. When atomic clustering is present, it typically occurs over dimensions that are small compared to the wavelength of the actinic radiation.

As used herein, the term "plasma" means a partially ionized gaseous or fluid state of matter containing reactive species which include electrons, ions, neutral molecules, free radicals, and other excited state atoms and molecules. Visible light and other radiation are typically emitted from the plasma as the species including the plasma relax from various excited states to lower or ground states. The plasma usually appears as a colored cloud in the reaction chamber.

As used herein, the term "negative bias" means that an object (e.g., an electrode) has a negative electrical potential with respect to some other matter (e.g., a plasma) in its vicinity.

As used herein, the term "negative self bias", with respect to an electrode and a plasma, means a negative bias developed by application of power (e.g., radio frequency) to an electrode that creates a plasma.

Advantages of the invention will be apparent from the following description, figures, examples, and the appended claims.

BRIEF DESCRIPTION OF THE DRAWINGS

Embodiments of the present invention are set forth in the following description and are shown in the drawings. Similar numerals refer to similar parts throughout the drawings.

Figure 1:
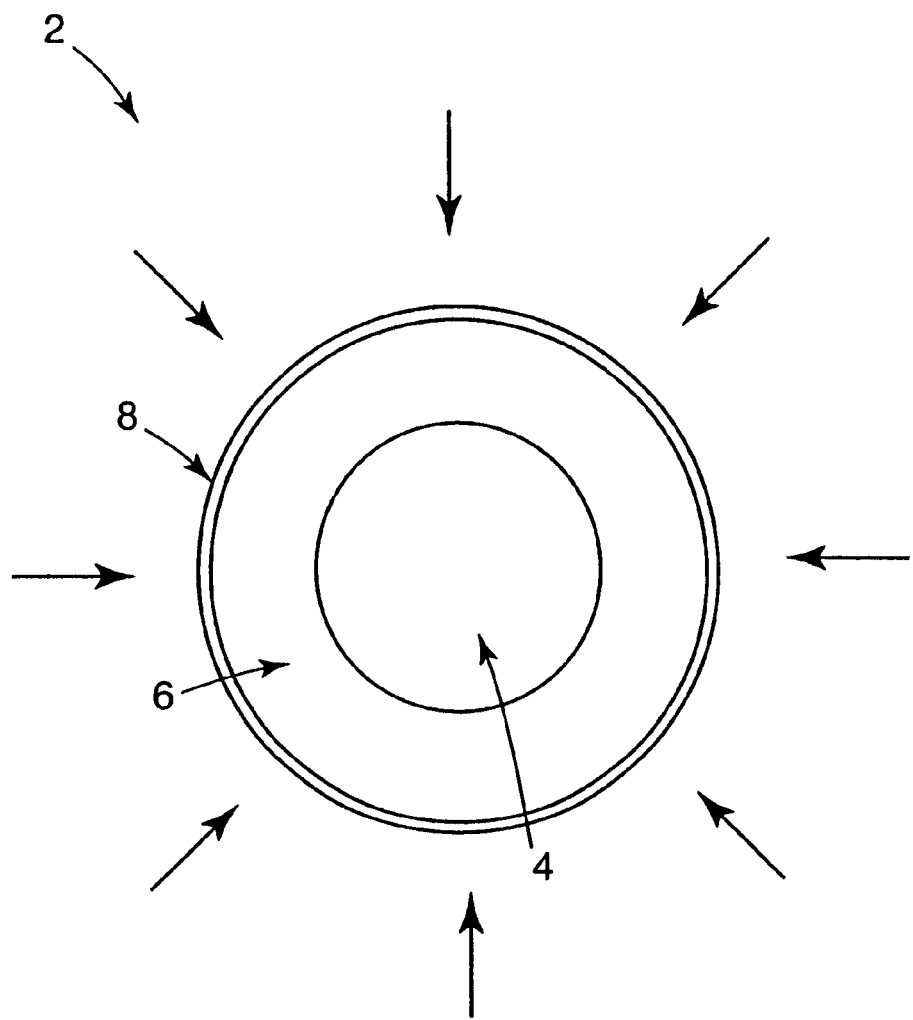
FIG. 1 is a cross-sectional drawing of an optical fiber covered with a vapor-deposited thin film formed in accordance with an implementation of the invention.

The invention is susceptible to various modifications and alternative forms, and specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as described by the following detailed description and as defined by the appended claims.

DETAILED DESCRIPTION OF THE INVENTION

The present invention is directed to articles, methods of making the articles, and apparatus for making the articles. In specific implementations, the articles include a glass substrate with a protective layer of a diamond-like film. The glass substrate is optionally capable of demonstrating a change in physical properties such as refractive index upon exposure to actinic radiation, and the diamond-like film is typically an amorphous system that allows passage, i.e., is transmissive, of actinic radiation into the glass substrate. In this manner, the diamond-like film is "write-through" because the actinic radiation may pass through the film and into the substrate in order to generate changes in refractive index of the substrate, or is able to induce other changes in the substrate, such that the substrate may be "written in" through the film.

A. Suitable Substrate Materials

Substrates suitable for use with the present invention are those whose physical properties are altered when they are exposed to actinic radiation. Such properties include, for example, refraction index, optical loss, optical nonlinearity coefficients, and electrical conductivity. Suitable substrates include, for example, optical fibers, planar substrates including planar waveguides, and optical recording media. For example, some glass substrates include dopants, such as germanium and boron, in specific regions that cause that region to be susceptible to increases in refractive index upon exposure to actinic radiation. These radiation sensitive regions are often produced in optical glass substrates in order to make gratings. Examples of such substrates are described in U.S. Pat. No. 5,940,568, U.S. Pat. No. 5,636,309, and U.S. Pat. No. 5,495,548, all incorporated by reference. The photosensitivity of the substrates may be further enhanced by the addition of a sensitizing gas such as hydrogen or deuterium.

FIG. 1 depicts a an optical fiber 2 with a diamond-like film. Fiber 2 includes glass core 4, and a glass cladding 6. A film 8 is deposited on the outside of the cladding 6. In the embodiment depicted, it will be observed that the film 8 is considerably thinner than the combined core 4 and cladding 6. Typically the film is highly uniform in thickness, composition, and concentricity. Although thin, the film can provide significant protection and aids in maintaining the mechanical robustness of fiber 2.

B. Diamond-Like Films

Various diamond-like films are suitable for the present invention. As the term is used herein, "diamond-like film" refers to substantially or completely amorphous films included of carbon, and optionally including one or more additional components selected from the group including hydrogen, nitrogen, oxygen, fluorine, silicon, sulfur, titanium, and copper. Other elements may be present in certain embodiments. As noted above and described below, the diamond-like films include approximately 25 to 100 atomic percent carbon, with optional additional components making up the remainder.(References to compositional percentages herein refer to atomic percents.) The films may be covalently coupled or interpenetrating. The amorphous diamond-like films of this invention may contain clustering of atoms that give a short-range order but are essentially void of medium and long range ordering that lead to micro or macro crystallinity which can adversely scatter actinic radiation having wavelengths of from about 180 nm to about 800 nm.

Several special classes of covalently bonded diamond-like films are useful in this invention. The simplest of these are the diamond-like carbon (DLC) films which include carbon and up to about 70% hydrogen, preferably about 10 to about 70%. In DLC films, hydrogen promotes diamond-like, tetrahedral bonding. Hydrogen addition increases the optical transparency of the DLC films by reducing double bonds and conjugation of double bonds in the films.

The next class of suitable diamond-like films includes diamond-like networks (DLN). In DLN, the amorphous carbon-based network is doped with other elements in addition to hydrogen. These may include fluorine, nitrogen, oxygen, silicon, copper, iodine, boron, etc. DLN contains at least about 25% carbon. Typically the total concentration of these one or more additional elements is low (less than about 30%) in order to preserve the diamond-like nature of the films.

A further class of useful diamond-like film materials is diamond-like glass (DLG), in which the amorphous carbon structure includes a substantial quantity of silicon and oxygen, as in glass, yet still retains diamond-like properties. In these films, on a hydrogen-free basis, there is at least about 30% carbon, a substantial amount of silicon (at least about 25%) and not more than about 45% oxygen. The unique combination of a fairly high amount of silicon with a significant amount of oxygen and a substantial amount of carbon make these films highly transparent and flexible (unlike glass).

The diamond-like glass films typically include on a hydrogen-free basis at least about 25 atomic percent carbon, from about 0 to about 50 atomic percent silicon, and from about 0 to about 50 atomic percent oxygen. In certain implementations, the film includes from about 25 to about 70 atomic percent carbon, from about 20 to about 40 atomic percent silicon, and from about 20 to about 40 atomic percent oxygen. In another implementation, the film includes from about 30 to about 36 atomic percent carbon, from 26 to about 32 atomic percent silicon, and from about 35 to about 41 atomic percent oxygen on a hydrogen-free basis.

In addition, a class of interpenetrating diamond-like films is useful in this invention. These diamond-like thin films are called DYLYN and are interpenetrating systems of two materials. These interpenetrating diamond-like thin films are disclosed in, e.g., U.S. Pat. No. 5,466,431, incorporated herein by reference.

Thin films made in accordance with the invention may have a variety of light transmissive properties. Depending upon the application, the thin films may have increased transmissive properties at various frequencies. However, in specific implementations the thin film is at least 50 percent transmissive to radiation at one or more wavelength from about 180 to about 800 nanometers. In particular, the thin film should be transmissive to light at the wavelength of the actinic radiation used to alter the refractive index of the substrate. The thin film should be sufficiently transmissive of the actinic radiation that a dose of radiation sufficient to impart a satisfactory change in the substrate does not excessively damages the thin film. Thus, the thin film must be able to continue to perform as a protector and strengthener of the substrate after application of the actinic radiation.

Typical fiber optic Bragg gratings are written using pulsed excimer lasers that typically deliver 26 mJ/cm$^2$ per pulse at 50 Hz repetition rate at a wavelength of 248 nm. Alternatively, fiber Bragg gratings may also be written with continuous wave lasers, such as frequency doubled Argon ion lasers operating at writing beam power densities of 4000 W/cm$^2$ at a wavelength of 244 nm. Exposures to these energy densities typically ablate or char standard acrylate optical fiber coatings. Therefore, the film preferably remains deposited on the substrate and is still able to be written through after exposure to light from a frequency doubled Argon laser operating at writing beam power densities of 4000 W/cm$^2$ at a wavelength of 244 nm for one hour. Other sources of actinic radiation that can be used in the present invention include neodymium YAG lasers equipped with frequency tripler and quadrupler crystals, $CO_2$ lasers, femtosecond lasers, X-Rays, electron beams, proton beams, flames, plasmas, etc.

Notably, the present films are particularly useful for forming long Bragg gratings because they have uniformity, good concentricity, and few surface irregularities. Also, the film can easily be deposited in only certain sections of a substrate, and thus can be continuous or discontinuous. Also, the film can have a controlled, yet variable, thickness along a substrate.

Diamond thin films, having significantly different properties from the diamond-like film of the present invention due to the arrangement and intermolecular bonds of carbon atoms in the specific material, have previously been deposited on substrates. The type and amount of intermolecular bonds are determined by infrared (IR) and nuclear magnetic resonance (NMR) spectra. Carbon deposits contain substantially two types of carbon-carbon bonds: trigonal graphite bonds ($sp^2$) and tetrahedral diamond bonds ($sp^3$). Diamond is composed of virtually all tetrahedral bonds, while diamond-like films are composed of approximately 50 to 90% tetrahedral bonds, and graphite is composed of virtually all trigonal bonds.

The crystallinity and the nature of the bonding of the carbonaceous film determine the physical and chemical properties of the deposit. Diamond is crystalline whereas the diamond-like films of the invention are a non-crystalline amorphous material, as determined by x-ray diffraction. Diamond is essentially pure carbon, whereas diamond-like film can contain a substantial amount of additional components (up to approximately 50 atomic percent for a single non-carbon component, and up to approximately 75 atomic percent for the combination of all additional non-carbon components). These atomic percents can be determined by combustion analysis.

Diamond has the highest packing density, or gram atom density (GAD) of any material at ambient pressure. Its GAD is 0.28 gram atoms/cc. Amorphous diamond-like films have a GAD ranging from about 0.20 to 0.28 gram atoms/cc. In contrast, graphite has a GAD of 0.18 gram atoms/cc. The high packing density of amorphous diamond-like film affords excellent resistance to diffusion of liquid or gaseous materials. Gram atom density is calculated from measurements of the weight and thickness of a material. "Gram atom" refers to the atomic weight of a material expressed in grams.

Amorphous diamond-like films are diamond-like because, in addition to the foregoing physical properties that are similar to diamond, they have many of the desirable performance properties of diamond such as extreme hardness (1000 to 2000 kg/mm$^2$), high electrical resistivity ($10^9$ to $10^{13}$ ohm-cm), a low coefficient of friction (0.1), and optical transparency over a wide range of wavelengths (an extinction coefficient of less than 0.1 in the 400 to 800 nanometer range).

Diamond films also have some properties which, in many applications, make them less beneficial as a protective layer than amorphous diamond-like films. Diamond films have grain structures, as determined by electron microscopy. The grain boundaries are a path for chemical attack and degradation of the substrates, and also cause scattering of actinic radiation. Amorphous diamond-like films do not have a grain structure, as determined by electron microscopy, and are thus well suited to applications wherein actinic radiation will pass through the film.

The polycrystalline structure of diamond films causes light scattering from the grain boundaries, which can reduce write-through efficiency. Surprisingly, diamond-like films in accordance with the invention allow for excellent light transmission. Additionally, the present inventors found that the visible light transmission of a carbon and hydrogen based film could be further improved by incorporating silicon and oxygen atoms into the amorphous diamond-like structure during the deposition process. This is not possible for diamond thin films because additional components will disrupt its crystalline lattice structure.

In creating a diamond-like film, various additional components can be incorporated into the basic amorphous carbon or carbon and hydrogen system. These additional components can be used to alter and enhance the properties that the diamond-like film imparts to the substrate. For example, it may be desirable to further enhance the barrier and surface properties.

The additional components may include one or more of hydrogen (if not already incorporated), nitrogen, oxygen, fluorine, silicon, sulfur, titanium, or copper. Other additional components may also work well. The addition of hydrogen promotes the formation of tetrahedral bonds. The addition of fluorine is particularly useful in enhancing barrier and surface properties of the diamond-like film, including the ability to be dispersed in an incompatible matrix. The addition of silicon and oxygen tend to improve the optical transparency and thermal stability of the diamond-like film. The addition of nitrogen may be used to enhance resistance to oxidation and to increase electrical conductivity. The addition of sulfur can enhance adhesion. The addition of titanium tends to enhance adhesion as well as diffusion and barrier properties.

C. Apparatus for Forming Diamond-Like Films

Figure 2:
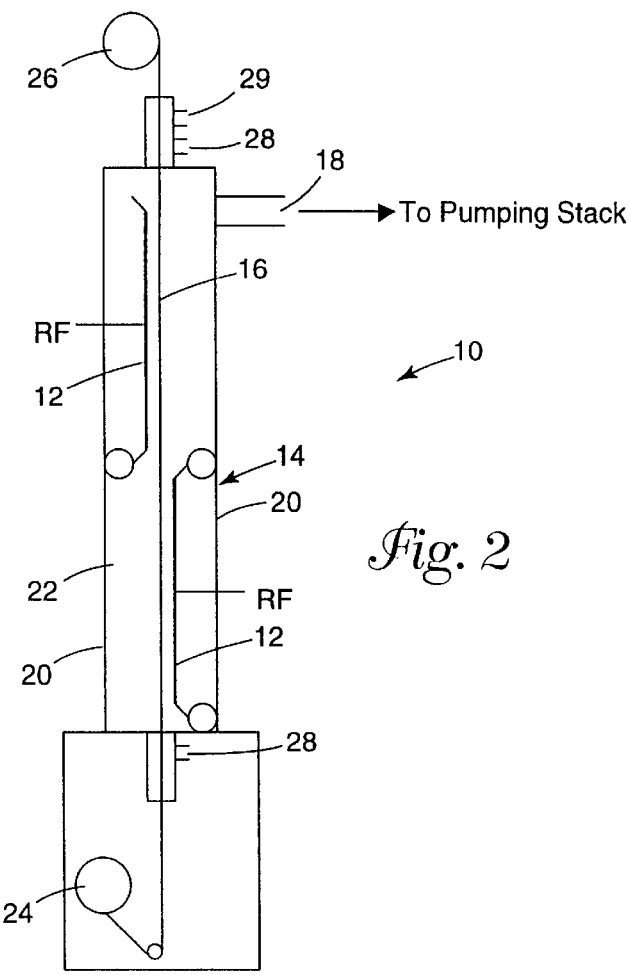
FIG. 2 is a schematic plan view of a first plasma reactor used to prepare examples of the present invention.

The figures illustrate aspects of an apparatus for preparing the diamond-like film-deposited substrates of this invention. FIG. 2 illustrates a system 10 for forming diamond-like films on a substrate. System 10 includes electrodes 12 one or both of which are powered by RF (typically only one electrode is powered, but both may be powered such that they are 180 degrees out of phase and have what is known in the art as a push-pull configuration) and a grounded reaction chamber 14, which has a surface area greater than that of powered electrode(s) 12. A substrate 16 is placed proximate one of the electrodes, an ion sheath is formed around each powered electrode, and a large electric fields is established across the ion sheath.

Reaction chamber 14 is pumped to remove most air, such as by means of vacuum pumps at a pumping stack connected to chamber 14 at opening 18. Aluminum is a preferred chamber material because it has a low sputter yield, which means that very little contamination of the diamond-like film occurs from the chamber surfaces. However, other suitable materials, such as graphite, copper, glass or stainless steel, may be used.

It will be noted that chamber 14 can be any means of providing a controlled environment that is capable of evacuation, containment of gas introduced after evacuation, plasma creation from the gas, ion acceleration, and film deposition. In the embodiment shown in FIGS. 2 and 3, chamber 14 has outer walls 20 that are constructed in a manner sufficient to allow for evacuation of chamber interior 22 and for containment of a fluid for plasma creation, ion acceleration, and film deposition. A vacuum is maintained at the inlet and exit of the chamber by two roughing pumps (not shown), one of which is attached at locations 28 and the other of which is attached at location 29.

Also, in the implementation shown, the substrate 16 is a long fiber that has a source spool 24 and a destination spool 26. In operation, substrate 16 travels from source spool 24, past the electrodes 12, and on to the destination spool 26. These spools 24, 26 are optionally enclosed within chamber 14, or can be outside chamber 14, as long as a low-pressure plasma may be maintained within the chamber 14. In some embodiments, such as when optical glass fibers have a diamond-like film deposited on them, the fibers are continuously drawn form a silica preform in a draw furnace then are fed into a plasma chamber where the diamond-like film is deposited.

The desired process gases are supplied from storage through an inlet tube. A stream of gas is distributed throughout the chamber. Chamber 14 is closed and partially evacuated to the extent necessary to remove species that might contaminate the diamond-like film. The desired gas (e.g., a carbon- or hydrocarbon-containing gas) is introduced into chamber 14 at a desired flow rate, which depends on the size of the reactor and the amount of substrate in the reactor. Such flow rates must be sufficient to establish a suitable pressure at which to carry out plasma deposition, typically 0.13 Pa to 130 Pa (0.001 Torr to 1.0 Torr). For a reactor that has an inner diameter of approximately 55 cm and a height of approximately 20 cm, the flow rates are typically from about 50 to about 500 standard cubic centimeters per minute (sccm).

Plasma is generated and sustained by means of a power supply (an RF generator operating at a frequency in the range of 0.001 to 100 MHz). To obtain efficient power coupling (i.e., wherein the reflected power is a small fraction of the incident power), the impedance of the plasma load can be matched to the power supply by means of a matching network including two variable capacitors and an inductor, available from RF Power Products, Kresson, N.J., as Model # AMN 3000. A description of such networks can be found in Brian Chapman, *Glow Discharge Processes*, 153 (John Wiley & Sons, New York 1980).

The RF power source powers the electrode with a typical frequency in the range of 0.01 to 50 MHz, preferably 13.56 MHz or any whole number (e.g., 1, 2, or 3) multiple thereof. This RF power as supplied to the electrode to create a carbon-rich plasma from the hydrocarbon gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an RF plasma the powered electrode becomes negatively biased relative to the plasma. This bias is generally in the range of 100 to 1500 volts. This biasing causes ions within the carbon-rich plasma to accelerate toward the electrode to form an ion sheath. Accelerating ions form the carbon-rich deposit on the substrate in contact with electrode.

The depth of the ion sheath normally ranges from approximately 1 mm (or less) to 50 mm and depends on the type and concentration of gas used, pressure applied, and relative size of the electrodes. For example, reduced pressures will increase the size of the ion sheath as will having different sized electrodes. When the electrodes are different sizes, a larger (i.e., deeper) ion sheath will form around the smaller electrode. Generally, the larger the difference in electrode size, the larger the difference in the size of the ion sheaths. Also, increasing the voltage across the ion sheath will increase ion bombardment energy.

Deposition of the diamond-like film typically occurs at rates ranging from about 1 to 100 nm/second (about 10 to 1000 Angstrom per second (A/sec)), depending on conditions including pressure, power, concentration of gas, types of gases, relative size of electrodes, etc. In general, deposition rates increase with increasing power, pressure, and concentration of gas, but the rates will approach an upper limit.

Figure 3:
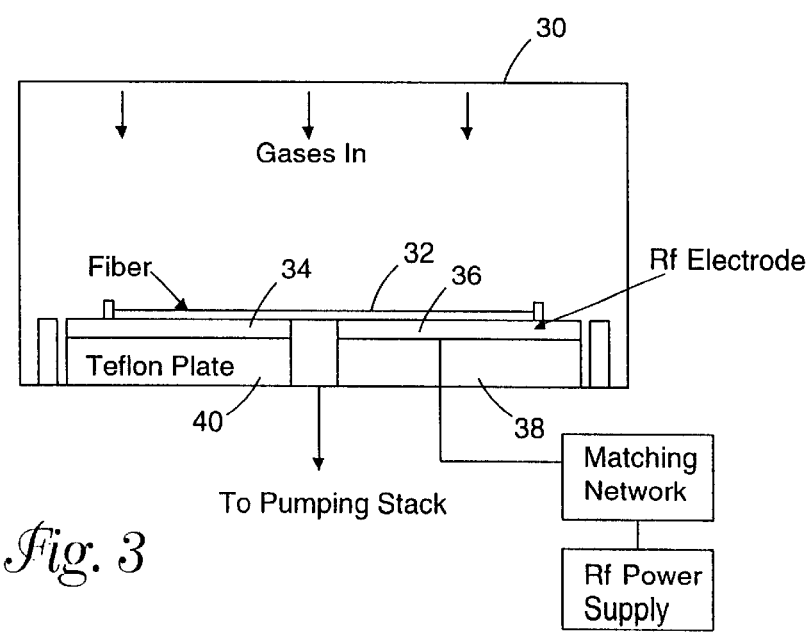
FIG. 3 is a schematic plan view of a second plasma reactor used to prepare examples of the present invention.

An alternative design for an apparatus constructed in accordance with the invention is shown in FIG. 3. FIG. 3 shows a chamber 30 from which air is removed by a pumping stack (not shown). Replacement gases to form the plasma are injected though at least one wall of the chamber. A fiber substrate 32 is positioned proximate RF-powered electrodes 34, 36. Electrodes 34, 36 are insulated from the chamber 30 by Teflon supports 38, 40.

D. Methods of depositing a Diamond-like Film on the Substrate

The invention is further directed to a method of depositing a diamond-like film onto a substrate, including deposit of a write-through diamond-like film onto a glass substrate. In specific implementations, the method includes providing a capacitively coupled reactor system having two electrodes in an evacuable reaction chamber. The chamber is partially evacuated, and radio frequency power is applied to one of the electrodes. A carbon-containing source is introduced between the electrodes to form a plasma including reactive species in proximity to the electrodes, and to also form an ion sheath proximate at least one electrode. The glass substrate is exposed to the reactive species within the ion sheath that is proximate an electrode to form a diamond-like thin film on the substrate. The conditions can result in a thin film that includes a diamond-like covalent structure including on a hydrogen-free basis at least 30 atomic percent carbon, from 0 to 50 atomic percent silicon, and from 0 to 50 atomic percent oxygen.

In the method of this invention, diamond-like films are deposited by plasma deposition onto substrates from gases containing carbon and, in most cases, additional components. Deposition occurs at reduced pressures (relative to atmospheric pressure) and in a controlled environment. A carbon-rich plasma is created in a reaction chamber by applying an electric field to a carbon-containing gas. Substrates for film deposition are held in a vessel or container in the reactor.

Species within the plasma react on the substrate surface to form covalent bonds, resulting in an amorphous diamond-like film on the surface of the substrates. A multiplicity of substrates may be simultaneously exposed to the deposition plasma during the process of this invention. The substrates can be held in, or passed through, a vessel or container within an evacuable chamber that is capable of maintaining conditions that produce diamond-like film deposition. That is, the chamber provides an environment which allows for the control of, among other things, pressure, the flow of various inert and reactive gases, voltage supplied to the powered electrode, strength of the electric field across the ion sheath, formation of a plasma containing reactive species, intensity of ion bombardment, and rate of deposition of a diamond-like film from the reactive species.

Prior to the deposition process, the chamber is evacuated to the extent necessary to remove air and any impurities. Inert gases (such as argon) may be admitted into the chamber to alter pressure. Once the substrate is placed in the chamber and it is evacuated, a substance containing carbon (and usually hydrogen), and optionally a substance from which an additional component can be deposited, is admitted into the chamber and, upon application of an electric field, forms a plasma from which the amorphous diamond-like film is deposited. At the pressures and temperatures of diamond-like film deposition (typically 0.13 to 133 Pa (0.001 to 1.0 Torr) (all pressures stated herein are gauge pressure) and less than 50° C.), the carbon-containing substances and substances from which an optional additional component may be obtained will be in their vapor form.

For the deposition of carbon and hydrogen in a diamond-like film, hydrocarbons are particularly preferred, including acetylene, methane, butadiene, benzene, methylcyclopentadiene, pentadiene, styrene, naphthalene, and azulene. Mixtures of these hydrocarbons may also be used. Gases containing optional additional components can also be introduced into the reaction chamber. Gases with low ionization potentials, i.e., 10 eV or less, typically are used for efficient deposition of the diamond-like film.

The additional optional diamond-like film components, including one or ore of hydrogen, nitrogen, oxygen, fluorine, silicon, sulfur, titanium, or copper, may be introduced in vapor form into the reaction chamber during the deposition process. Typically, even when the sources for the additional components are solids or fluids the reduced pressure in the reaction chamber will cause the source to volatilize. Alternatively, the additional components may be entrained in an inert gas stream. The additional components may be added to the chamber while a carbon- or hydrocarbon-containing gas is sustaining the plasma and/or may be added to the chamber after the flow of carbon- or hydrocarbon-containing gas has been stopped.

Sources of hydrogen include hydrocarbon gases and molecular hydrogen ($H_2$). Sources of fluorine include compounds such as carbon tetrafluoride ($CF_4$), sulfur hexafluoride ($SF_6$), perfluorobutane ($C_4F_{10}$), $C_2F_6$, $C_3F_8$, and $C_4F_{10}$. Sources of silicon include silanes such as $SiH_4$, $Si_2H_6$, tetramethylsilane, and hexamethyldisiloxane. Sources of oxygen include oxygen gas ($O_2$), hydrogen peroxide ($H_2O_2$), water ($H_2O$), and ozone ($O_3$). Sources of nitrogen include nitrogen gas ($N_2$), ammonia ($NH_3$), and hydrazine ($N_2H_6$). Sources of sulfur include sulfur hexafluoride ($SF_6$), sulfur dioxide ($SO_2$), and hydrogen sulfide ($H_2S$). Sources of copper include copper acetylacetonate. Sources of titanium include titanium halides such as titanium tetrachloride.

The ion sheath around the smaller electrode is necessary to obtain ion bombardment, which, in turn, is necessary to produce a densely-packed diamond-like film. An explanation of the formation of ion sheaths can be found in Brian Chapman, *Glow Discharge Processes*, 153 (John Wiley & Sons, New York 1980).

The electrodes may be the same size or different sizes. If the electrodes are different sizes, the smaller electrode will have a larger ion sheath (regardless of whether it is the grounded or powered electrode). This type of configuration is referred to as an "asymmetric" parallel plate reactor. An asymmetric configuration produces a higher voltage potential across the ion sheath surrounding the smaller electrode. Establishing a large ion sheath on one of the electrodes is preferred for this invention because the substrate is preferably located within an ion sheath to benefit from the ion bombardment effects that occur within the sheath.

Preferred electrode surface area ratios are from 2:1 to 4:1, and more preferably from 3:1 to 4:1. The ion sheath on the smaller electrode will increase as the ratio increases, but beyond a ratio of 4:1 little additional benefit is achieved. The reaction chamber itself can act as an electrode. A preferred configuration for this invention includes a powered electrode within a grounded reaction chamber that has two to three times the surface area of the powered electrode.

In an RF-generated plasma, energy is coupled into the plasma through electrons. The plasma acts as the charge carrier between the electrodes. The plasma can fill the entire reaction chamber and is typically visible as a colored cloud. The ion sheath appears as a darker area around one or both electrodes. In a parallel plate reactor using RF energy, the applied frequency is preferably in the range of 0.001 to 100 MHz, preferably 13.56 MHz or any whole number multiple thereof. This RF power creates a plasma from the gas (or gases) within the chamber. The RF power source can be an RF generator such as a 13.56 MHz oscillator connected to the powered electrode via a network that acts to match the impedance of the power supply with that of the transmission line and plasma load (which is usually about 50 ohms so as to effectively couple the RF power). Hence this is referred to as a matching network.

The ion sheath around the electrodes causes negative self-biasing of the electrodes relative to the plasma. In an asymmetric configuration, the negative selfbias voltage is negligible on the larger electrode and the negative bias on the smaller electrode is typically in the range of 100 to 2000 volts. While the acceptable frequency range from the RF power source may be high enough to form a large negative direct current (DC) self bias on the smaller electrode, it should not be high enough to create standing waves in the resulting plasma, which is inefficient for the deposition of diamond-like film.

For planar substrates, deposition of dense diamond-like carbon thin films can be achieved in a parallel plate reactor by placing the substrates in direct contact with a powered electrode, which is made smaller than the grounded electrode. This allows the substrate to act as an electrode due to capacitive coupling between the powered electrode and the substrate. This is described in M. M. David, et al., *Plasma Deposition and Etching of Diamond-Like Carbon Films*, AIChE Journal, vol. 37, No. 3, p. 367 (1991), incorporated herein by reference. In the case of an elongate substrate, the substrate is optionally pulled through the vacuum chamber continuously while a continuous RF field is placed on the powered electrode and sufficient carboncontaining gas is present within the chamber. A vacuum is maintained at the inlet and exit of the chamber by two roughing pumps (not shown), one of which is attached at locations 28 and the other of which is attached at location 29. The result is a continuous carbon-rich vapor-deposited thin film on an elongated substrate, and substantially only on the substrate.

E. Products

The film formed of the diamond-like network is suitable, for example, in specific applications for depositing on substrates that are glass fibers, including optical glass fibers used to transmit data, and for various secondary media such as wavelength division multiplexing, dispersion compensation devices, laser thermal compensation devices, etc. The films of the invention provide protection for the glass fibers without substantially lowering the fibers' strength. In addition, the film can be formed on the substrate in a highly uniform manner that provides improved optical and physical properties for the finished article. These films normally are relatively thin; specifically, up to about 100 $\mu$m, preferably up to about 50 $\mu$m, more preferably up to about 10 $\mu$m, and most preferably up to about 5 $\mu$m. When the film is highly transparent it may be thicker without excessive absorbence of light. Thus, for highly transparent films, such as diamond-like glass, the film may be (for example) 1 to 100 microns thick. This is advantageous in providing a strong fiber without compromising write through properties. For less transmissive materials, such as diamond-like carbon and diamond-like networks, the films are preferably thinner, such as from 0.01 to 0.30 microns thick. These films typically do not provide as much protection as thicker diamond-like glass films. Where DYLYN is used, the film is also preferably thinner than with diamond-like glass, typically from 0.1 to 10.0 microns.

Certain articles made in accordance with the present invention are suitable for use in making Bragg gratings. The write-through characteristics of the film, along with its generally uniform thickness allow for the formation of high quality Bragg gratings. The Bragg gratings can be formed quickly and with great precision. In addition, the method of making Bragg gratings in accordance with the invention permit the strength of the fibers to be substantially preserved, and even enhanced, compared to fibers that have not had films deposited in accordance with the invention.

The treated fibers of the invention are suitable for making in-line optical waveguide refractive index gratings. More specifically, one aspect of the present invention is directed to a method for making a pure-apodized, chirped fiber Bragg grating (FBG) of any length by translating a fiber with respect to an interferogram of actinic radiation with an intensity that is amplitude modulated as a function of time, as disclosed in U.S. Pat. No. 5,912,999 and related U.S. applications Ser. Nos. 09/110495 and 09/161944, which are incorporated herein by reference.

Optical waveguide refractive index gratings are periodic, aperiodic or pseudo-periodic variations in the refractive index of a waveguide. Gratings may be formed, for example, by physically impressing a modulation on the waveguide, by causing a variation of the refractive index along a photosensitive waveguideby exposing the waveguide to a pattern of actinic radiation, or by other methods known in the art. In particular, gratings written into the core of an optical fiber are critical components for many applications in fiber-optic communication and sensor systems.

Dopants, such as germanium, may be added to an area of the waveguide material to make it photosensitive, causing the refractive index of that area to be susceptible to increase upon exposure to actinic radiation. The currently preferred method of "writing" an in-line grating includes exposing a portion of the waveguide to the interference between two beams of actinic (typically UV) radiation. The two beams are incident on the guiding structure of the waveguide in a transverse direction to create an interferogram, that is, a pattern of optical interference. The angle between the two beams (and the wavelength of the radiation) defines the fringe spacing of the interferogram. Typically, the two beams of actinic radiation are the legs of an interferometer or are produced by launching a single beam through a phase mask. The phase mask method is considered generally more suitable for large scale manufacture of in-line gratings, because it is highly repeatable, less susceptible to mechanical vibrations of the optical setup, and can be implemented with writing beams of much shorter coherence length.

If such exposure is carried out using an interferometer or through a phase mask it is possible to write a periodically varying refractive index grating within the core of a fiber.

The reflectivity, reflection bandwidth and wavelength of such a Bragg structure are simply defined by the period and length of the phase mask and exposure time used.

In the foregoing description, certain terms have been used for brevity, clarity, and understanding. No unnecessary limitations are to be implied therefrom beyond the requirement of the prior art because such terms are used for descriptive purpose and are intended to be broadly construed. Moreover, the description and illustration of the invention is by way of example, and the scope of the invention is not limited to the exact details shown or described.

F. Examples

This invention may be illustrated by way of the following examples including the described test methods used to evaluate and characterize the diamond-like films produced in the examples.

Plasma Reactor Description

Reactor One: Diamond-like glass (DLG) films were deposited in a custom-built plasma reactor designed specifically for fiber substrates. This reactor, schematically illustrated in FIG. 2, included a vertical aluminum chamber having two linear aluminum electrodes that are nominally 610 mm (24 inches) long and 38 mm (1.5 inches) wide, located along the linear axis of the chamber, one above the other in a staggered arrangement, i.e., not vertically aligned. The sides and backside of the electrode were insulated by polyetherimide, available under the tradename ULTEM from Union Carbide, and capped off with ground planes made of aluminum so that only the front side of the electrodes were actively exposed to the plasma. The electrodes were powered by an RF power supply (Model CX1250 from Comdel Inc., Beverly, Mass.) and matching network (Model CPM-1000 from Comdel Inc.) and controller (Model MatchPro CPM from Comdel Inc.). Tetramethylsilane (TMS) and oxygen gases were introduced into the deposition chamber through mass flow controllers (from MKS Instruments, Andover, Mass.) and pumped by a roots blower (Model EH1200 from Edwards High Vacuum, Sussex, England,) backed by a mechanical pump (Model E2M80 from Edwards High Vacuum). Pressure in the chamber was controlled by a throttle valve and controller (Models 653 and 600 series, respectively, from MKS Instruments). The fiber substrates were passed from atmospheric conditions into the chamber through differentially pumped orifice plates. Roughing pumps were used to maintain a vacuum at the entrance and exit of the vacuum chamber.

Reactor Two: A commercial parallel-plate capacitively coupled plasma reactor (commercially available as Model 2480 from PlasmaTherm of St. Petersburg, Fla.) was modified and used for the deposition of DLG onto capillary tubes. This reactor, schematically illustrated in FIG. 3, included a grounded chamber electrode containing a powered electrode. The chamber is cylindrical in shape with an internal diameter of 26 inches and height of 12 inches. A circular electrode having a diameter of 55.9 cm (22 inches) was mounted inside and attached to a matching network and a 3 kW RF power supply that was operated at a frequency of 13.56 MHz. The chamber was pumped by a roots blower backed by a mechanical pump. Unless otherwise stated, the base pressure in the chamber was 0.67 Pa (5 mTorr). Process gases were metered into the chamber either through a mass flow controllers or a needle valve. All the plasma depositions and treatments were done with the substrate located on the powered electrode of the plasma reactor.

EXAMPLE 1

This example illustrates the effect of a low concentration ratio of tetramethyl silane (TMS) to oxygen on the write-through property of DLG thin films.

Acrylate-coated optical fibers (pure silica clad with optical core, the optical core being the most inner portion of the glass fiber and is made to have a higher refractive index by doping with germanium so the total internal reflection can occur to function as an optical fiber), having a nominal core diameter of 5 to 10 $\mu$m, a cladding diameter of 125 $\mu$m, and an acrylate coating diameter of 250 $\mu$m, available as Part No. CS-96-0110 from 3M Company—Optical Transport Systems, West Haven, Conn.) were stripped by dipping a 6 cm section of a long length of fiber sequentially into fuming sulfuric acid (at 175° C.), water and methanol that were poured into three separate beakers. The section of fiber was submerged in each liquid for about 30 seconds. The sectionally stripped fibers were mounted to a sample holder with the stripped section located in free-span and thus not making mechanical contact to any other surface. The sample holder was mounted against the powered electrode of Plasma Reactor One. The surface of the fiber facing away from the electrode was pre-cleaned by using an oxygen plasma at 13.3 Pa (100 mTorr) and 400 Watts for 15 seconds. After cleaning the first side, the chamber was opened, the holder was flipped around, the chamber was closed and the other side of the fiber was similarly pre-cleaned. After oxygen plasma cleaning, DLG films were deposited on the surface of the fibers by exposing each side of each fiber to a plasma for 10 minutes. The plasma was formed from a mixture of tetramethylsilane (TMS, available as a liquid from Aldrich Chemical Company, Milwaukee, Wis.) and oxygen (available in gas cylinders from Oxygen Service Company, Minneapolis, Minn.). The pressure and power were maintained at 20 Pa (150 mTorr) and 200 Watts respectively. The flowrate of TMS and oxygen were 150 standard cubic centimeters (sccm) and 750 sccm, respectively, to result in a ratio of TMS to $O_2$ of 0.2. The plasma treatment resulted in a DLG film with a thickness of 5 microns. A similar DLG film having a thickness of 1.0 micron was also placed on one side of a quartz slide for subsequent transmission testing.

Figure 4:
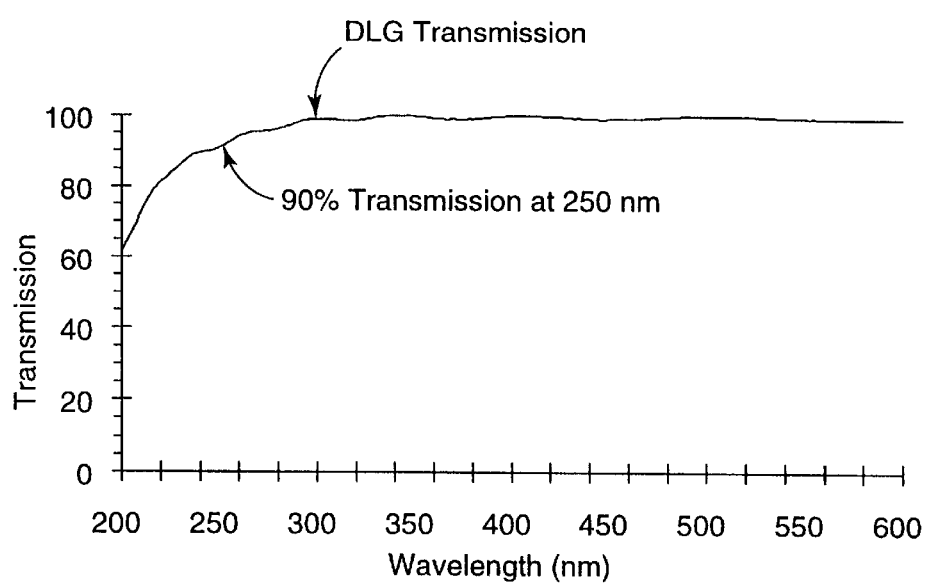
FIG. 4 is a transmission spectrum of an optical glass fiber deposited with a diamond-like glass thin film as prepared in example 1.

Optical transmission of the DLG film was measured on the film that was deposited onto the quartz slides. Transmission spectra were measured on a Model Lambda 900 Spectrophotometer available from Perkin Elmer Corporation, Norwalk, Conn. As seen in FIG. 4, the transmission was essentially water-clear with a transmission of 90% at 250 nanometers (nm), and higher transmission at longer wavelengths.

Figure 5:
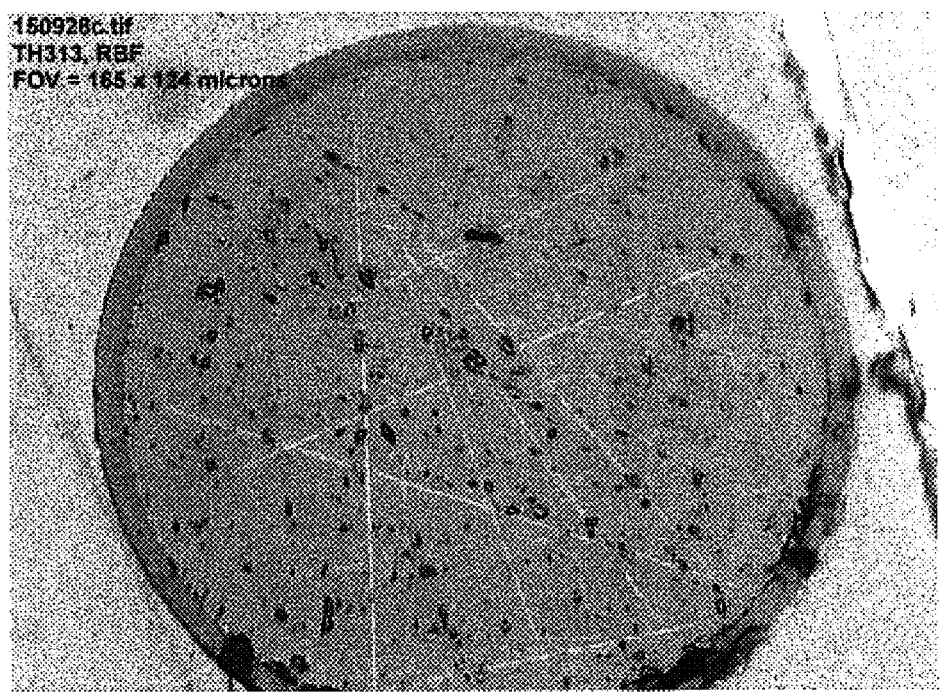
FIG. 5 is a cross-sectional digital image optical micrograph of an optical glass fiber deposited with a diamond-like glass thin film as prepared in example 1.

Thickness of the DLG thin film on the fiber was measured with an electron microscope. The thickness was 5.0 microns. The uniformity and concentricity of the thin film are shown in FIG. 5. As is evident from FIG. 5, the film demonstrated high degrees of both uniformity and concentricity.

Figure 6:
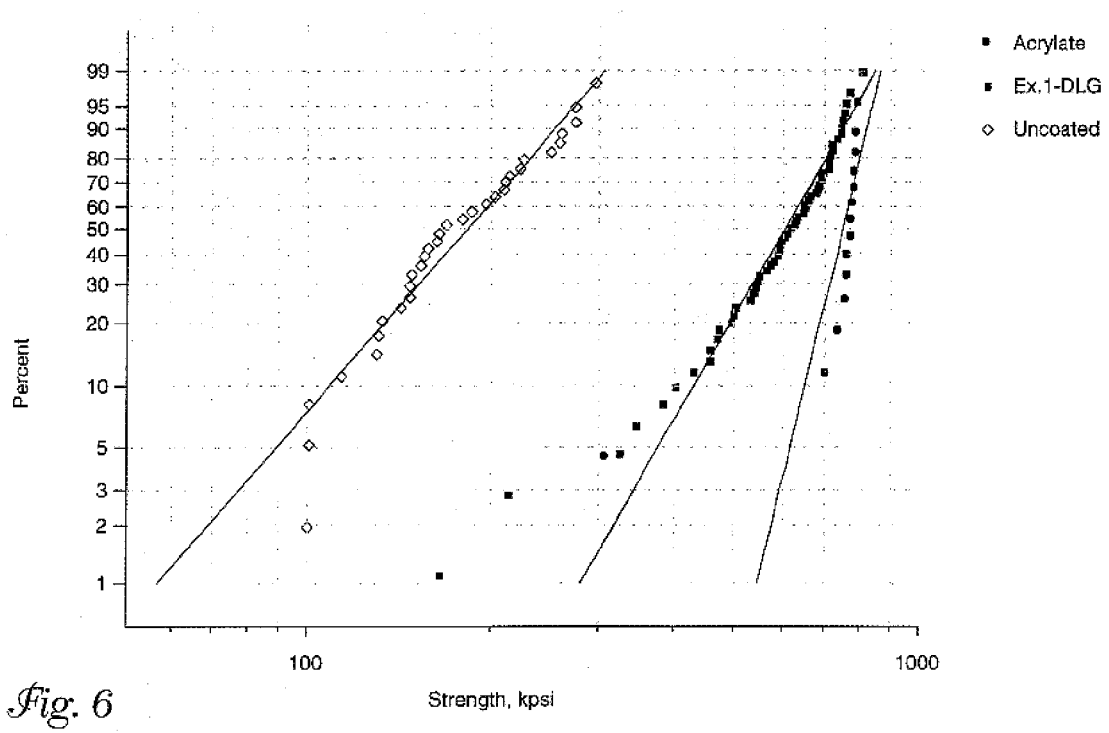
FIG. 6 is a Weibull plot comparing the strengths of optical glass fibers that are uncoated, coated with acrylate, and deposited with diamond-like glass thin films as prepared in example 1.

Mechanical properties of the thin film covered fibers were then compared with those of both the original acrylate-coated fibers and the stripped fibers. The DLG-protected fibers, like the acrylate-coated fibers, appeared insensitive to handling such as by wiping the fibers between fingers or wrapping them on mandrels. In contrast, stripped fibers easily broke under such handling. All three fibers were pull-tested in a Vytran proof tester (Model PTR-100, available from Vytran Corporation, Morganville, N.J.). As seen in FIG. 6, the probability of fracture for both the acrylate-coated and DLG-protected fibers occurred at higher tensile forces than that for stripped fibers.

The DLG-protected fiber was exposed to hydrogen gas at elevated an temperature and pressure to permit the hydrogen to diffuse into the photosensitive region of the fiber to increase the fiber's photosensitivity (a detailed description of the effects of hydrogen may be found in Raman Kashap, Fiber Bragg Gratings, Academic Press, San Diego (1999) and maintained at approximately −45° C. until a grating was written. The gratings were written using an excimer laser Lambda Physik (LPX210) and an interferometric writing method. The energy density was 26 mJ/cm$^2$ per pulse at 50 Hz repetition rate, corresponding to 240 mW in a spot approximately 9 mm (along fiber axis) by 2 mm. All DLG data were compared to data from stripped fiber taken on the same day to account for any variations in the interferometer system and to identify any effects from the DLG treatment.

Figure 7:
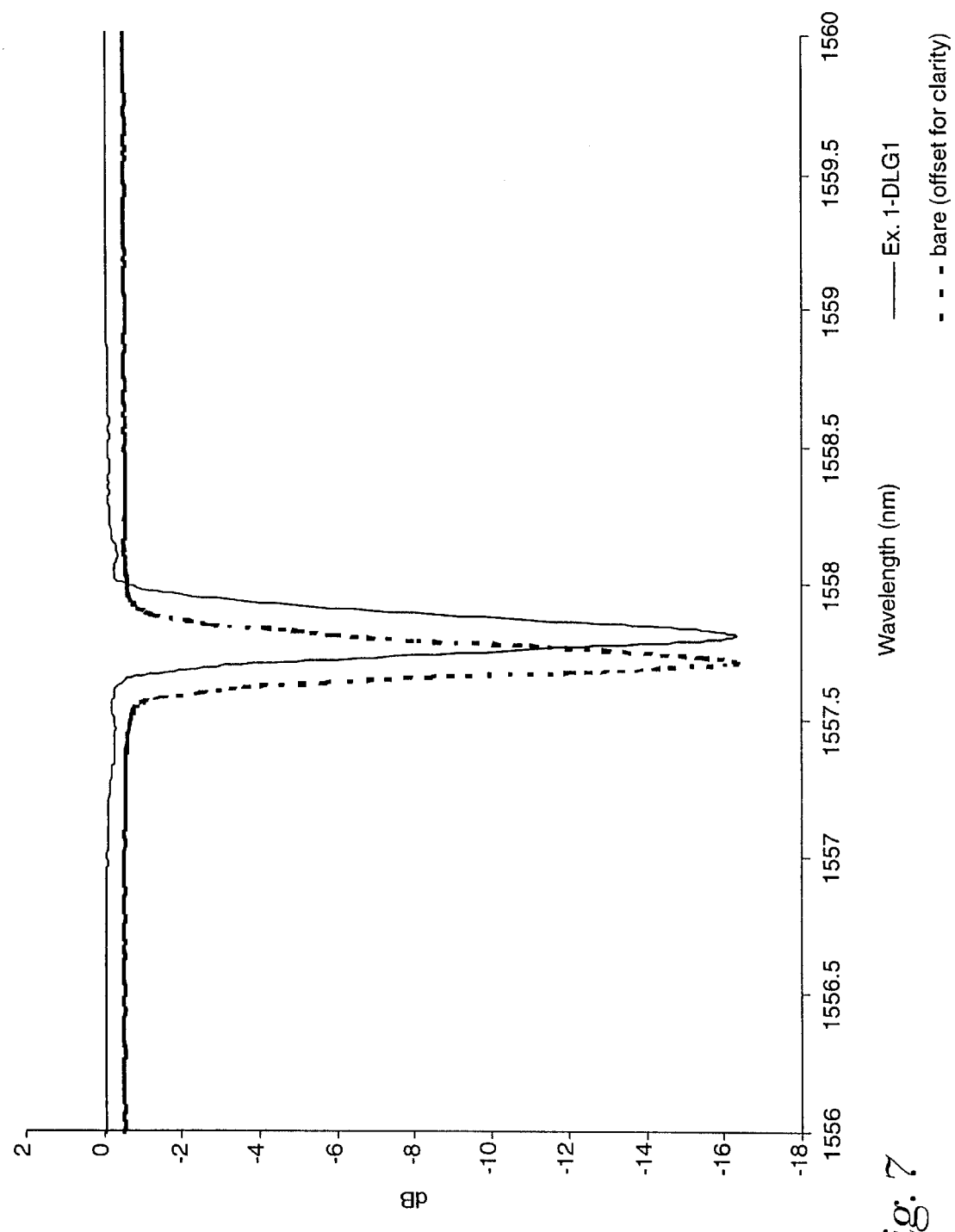
FIG. 7 is a grating transmission spectrum of a Bragg grating written in optical glass fibers deposited with diamond-like glass thin films as prepared in example 1.

Within experimental error, the results for the DLG samples were indistinguishable from the bare fiber samples. As seen in FIG. 7, the grating spectrum for a DLG sample (7A) was similar to that of a stripped fiber (7B). In contrast, the standard acrylate coating on the fiber was severely damaged under exposure to the excimer laser, and did not transmit the UV wavelengths.

EXAMPLE 2

This example illustrates the effect of a high concentration ratio of tetramethyl silane (TMS) to oxygen on the write-through property of DLG thin films.

DLG thin films were deposited onto stripped optical fibers as in Example 1 except the flow rates of the input gases were changed. The flow rates of TMS and oxygen were 150 sccm and 100 sccm, respectively resulting in a ratio of TMS to oxygen of 1.5. The pressure and power were maintained at 40 Pa (300 mTorr) and 200 Watts respectively. Furthermore, the RF power was pulsed at a frequency and duty cycle of 10 Hz and 90% respectively. A similar thin film, 0.1 μm thick, was deposited onto a silicon plate for subsequent determination of composition.

The composition of the DLG thin film was determined by x-ray photoelectron spectroscopy (XPS) using a Kratos AXIS Ultra system. In XPS, a focused x-ray beam irradiates the sample producing photoelectrons that are then characterized by their energy and intensity. The energies of the photoelectrons are specific to particular elements and their chemical states. XPS spectra were acquired for the samples as received then again after each time they were sputter etched with a 5 kV argon ion beam at approximately 5 nm intervals. The average composition, on a hydrogen free basis, was 33 atomic percent carbon, 29 atomic percent silicon, and 38 atomic percent oxygen. A depth profile was also acquired by Auger electron spectroscopy, which confirmed that the composition was uniform through the film's depth.

Figure 8:
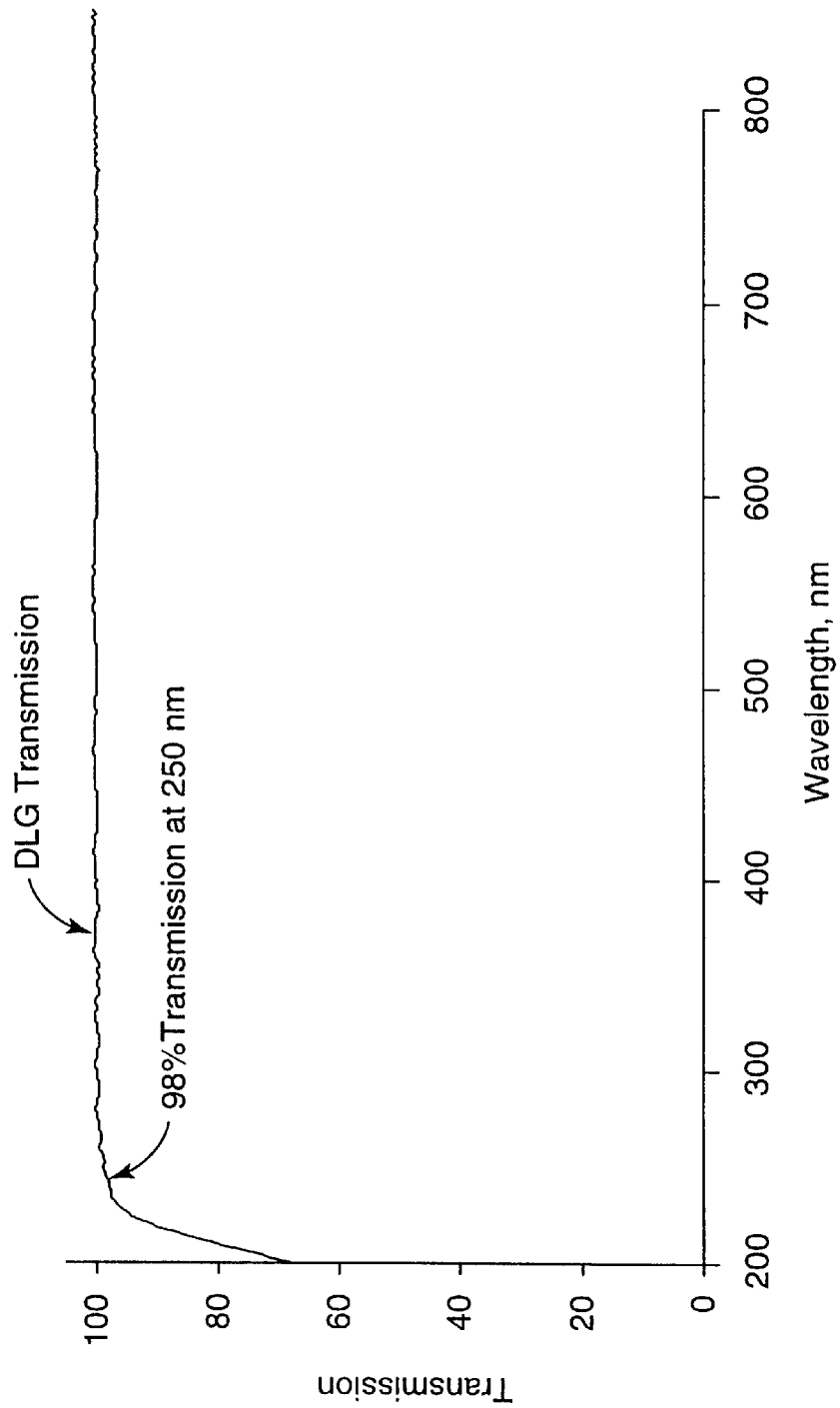
FIG. 8 is a transmission spectrum of an optical glass fiber deposited with a diamond-like glass thin film as prepared in example 2.
Figure 9:
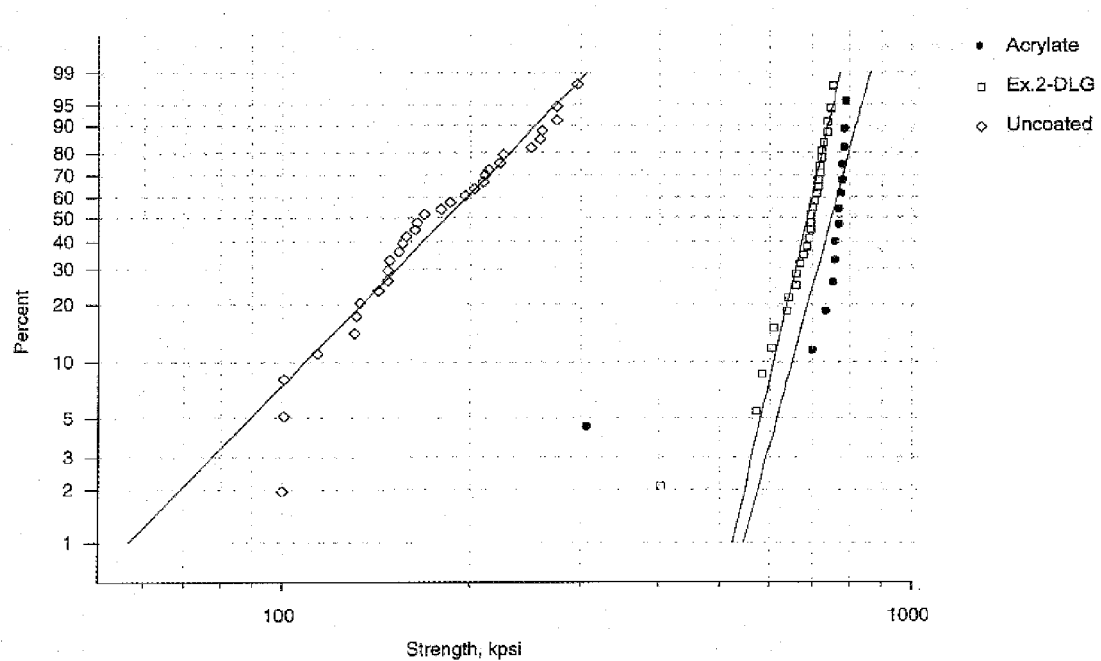
FIG. 9 is a Weibull plot of comparing the strengths of optical glass fibers that are uncoated, coated with acrylate, and deposited with diamond-like glass thin films as prepared in example 2.

The transmission of the DLG thin film of Example 2 was even greater than that of Example 1. As shown in FIG. 8, transmission at 250 nanometers was 98 percent. Likewise, the mechanical properties of the DLG thin film of Example 2 were improved over those of Example 1. Mechanical properties were measured by determining the mean strength at 50% probability of failure when measured according to Electronic Industries Association (EIA) Standard Test Procedure Fiber Optics Test Procedure FOTP-28. The Weibull plot for Example 2 is shown in FIG. 9. A Weibull plot is a plot of the breaking strengths of a statistical sample of optical fibers and it can be used to predict operating lifetimes under a given stress condition. Weibull plots are discussed in American National Standard Institute EIA/TIA Standard Fiber Optic Test Procedure FOTP-28, and references therein. See also 3M Technical Publication: Fredrick Bacon, "Silica Optical Fibers—Application Note" at page 3, available from 3M Optical Transport Systems, West Haven, Conn.

Figure 10:
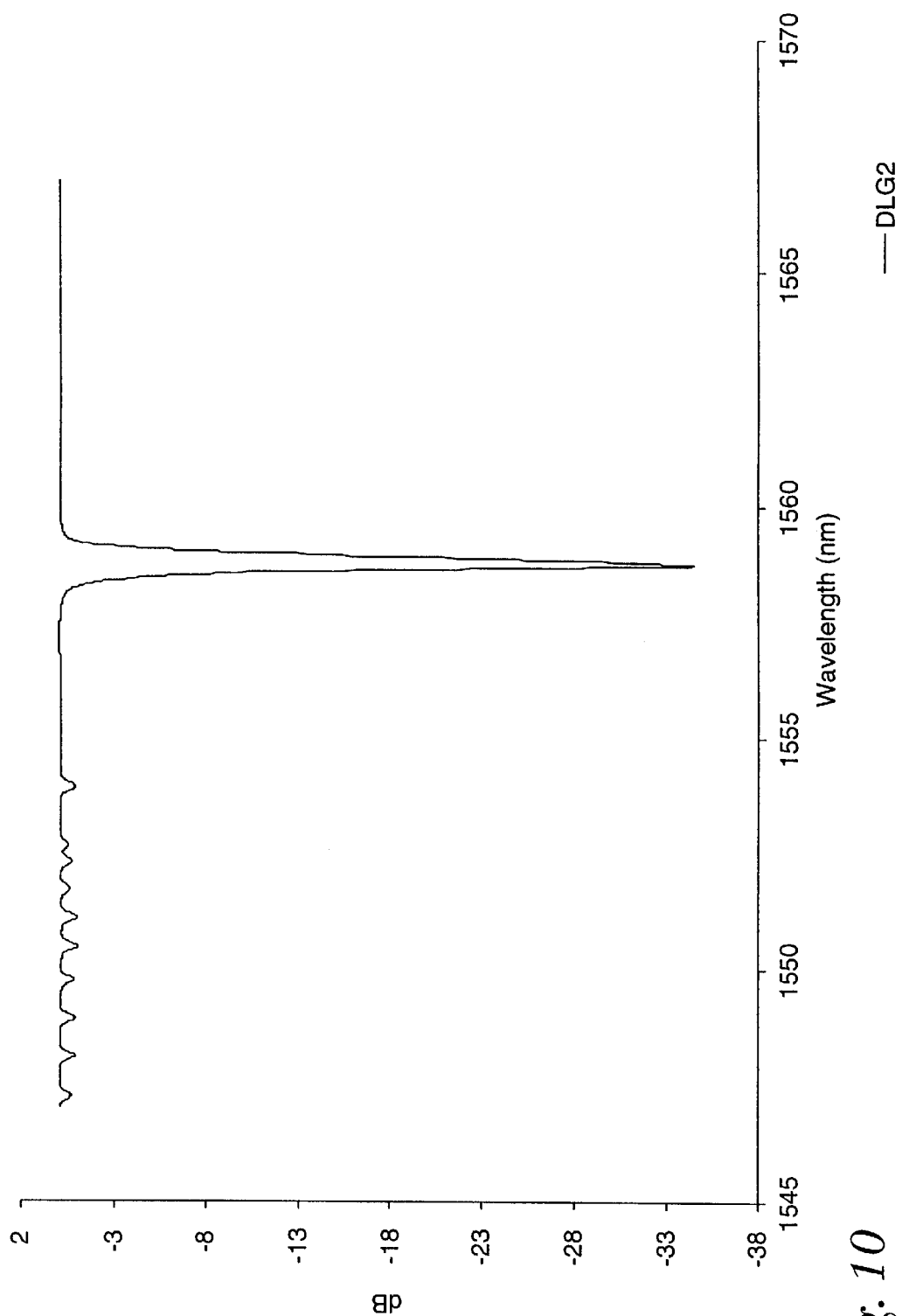
FIG. 10 is a grating transmission spectrum of a Bragg grating written in optical glass fibers deposited with diamond-like glass thin films as prepared in example 2.

The Bragg grating writing for Example 2 was similar to that of Example 1. FIG. 10 shows the grating transmission spectra for the DLG-protected fiber of Example 2. As shown by the similarity in transmission spectra, the presence of the DLG layer had no adverse effect when compared to the stripped fiber. The comparison with the bare fiber spectrum in FIG. 4A is not exact because the gratings were written under slightly different conditions. The grating procedure was conducted for a longer period of time, resulting in deeper (higher decibel value) gratings for the DLG-protected fiber.

EXAMPLE 3

This example illustrates diamond-like carbon (DLC) as a write-through thin film.

DLC thin films were deposited onto stripped optical fibers usingReactor Two The stripped sections of the fibers were suspended about 1 millimeter from the powered electrode, and quartz slides for optical transmission measurements were placed directly on the powered electrode. The samples were plasma cleaned prior to DLC deposition using argon (available in gas cylinders from Oxygen Service Company, Minneapolis, Minn.) at 3.3 Pa (25 mTorr) and 1 kWatt power for 10 seconds. After cleaning, DLC films were deposited by exposing the fibers to a trans-2-butene (available from Oxygen Service Company, Minneapolis, Minn.) plasma for 10 seconds. The flow rate of the trans-2-butene was 300 sccm, and the pressure and power were maintained at 12 Pa (90 mTorr) and 1 kWatt, respectively. The thickness of the DLC deposition was 200 Angstroms.

Figure 11:
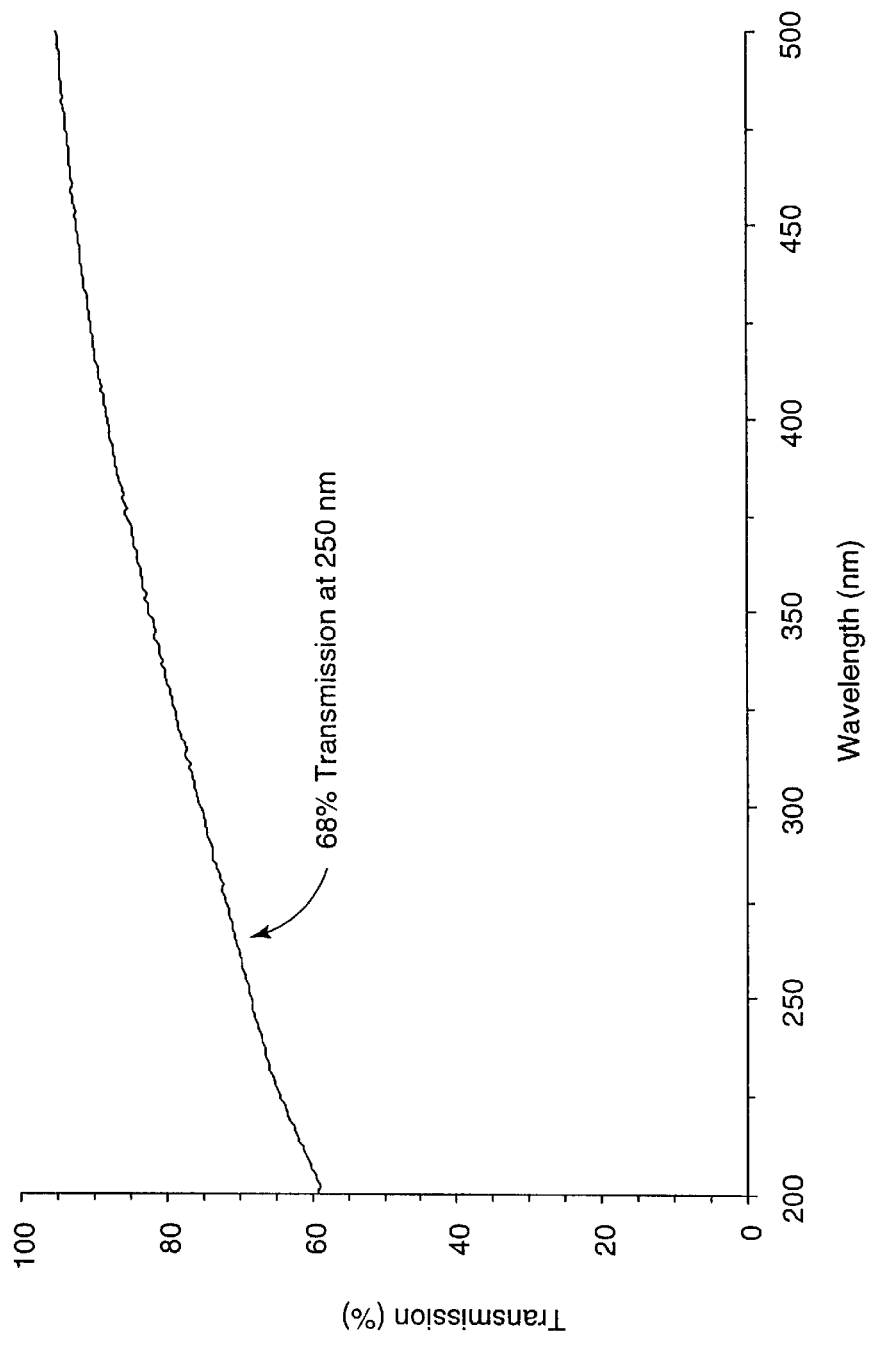
FIG. 11 is a transmission spectrum of an optical glass fiber deposited with a diamond-like carbon thin film as prepared in example 3.
Figure 12:
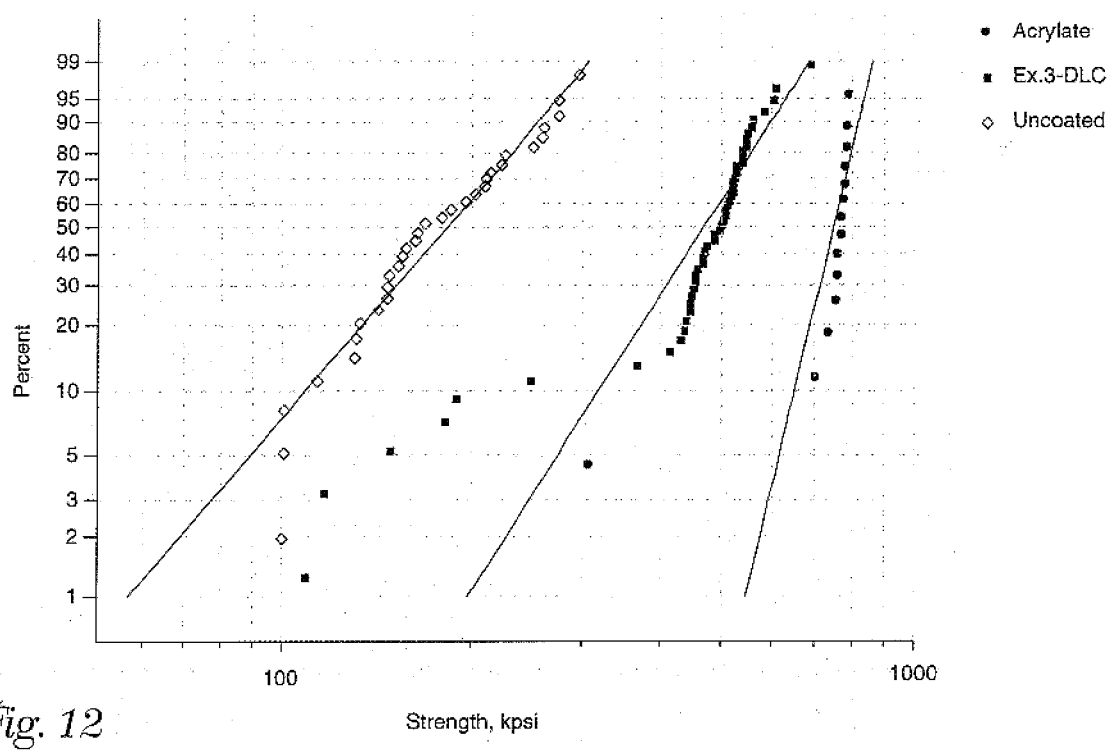
FIG. 12 is a Weibull plot comparing the strengths of optical glass fibers that are coated with acrylate, uncoated, and deposited with diamond-like carbon thin films as prepared in example 3.

The transmission of the DLC thin film of Example 3 was less than that of Example 1 because the thin film appeared brown in color. As shown on FIG. 11, transmission at 250 nanometers was 68 percent. The mechanical properties of the DLC thin film of Example 3 were weaker than those of Example 1 because DLC could not be applied as thick as DLG and retain comparable transparency. The Weibull plot for Example 3 is shown in FIG. 12.

The Bragg grating writing for Example 3 was similar to that of Example 1.

EXAMPLE 4

This example illustrates diamond-like network (DLN) as a write-through thin film.

DLN thin films were deposited onto stripped optical fibers as in Example 1 except the type of input deposition materials were different and the deposition conditions and flow rates of the input gases were changed. In addition, a very thin (approximately 250 Angstroms) hydrogenated DLC film was first deposited at the interface between the glass and the DLN film to ensure good adhesion of the DLN to the glass fiber. The flow rates of trans-2-butene (Oxygen Service, Minneapolis, Minn.) and octafluoropropane (3M Company Specialty Gases, St. Paul, Minn.) used to make the DLN were 100 sccm and 400 sccm, respectively. The pressure and power were maintained at 7.3 Pa (55 mTorr) and 500 Watts, respectively. The thickness of the DLN deposition was estimated to be 0.47 microns. A thin film was deposited onto a silicon wafer under the same processing conditions for subsequent determination of composition.

Figure 14:
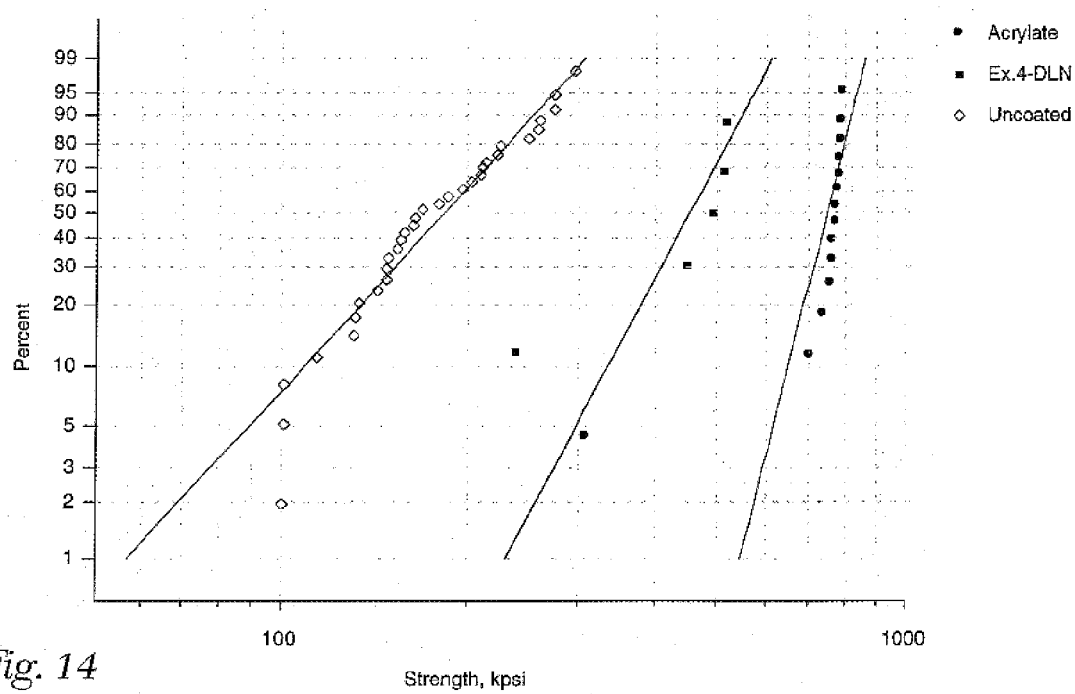
FIG. 14 is a Weibull plot comparing the strengths of optical glass fibers that are coated with acrylate, uncoated, and deposited with diamond-like network thin films as prepared in example 4.
Figure 15:
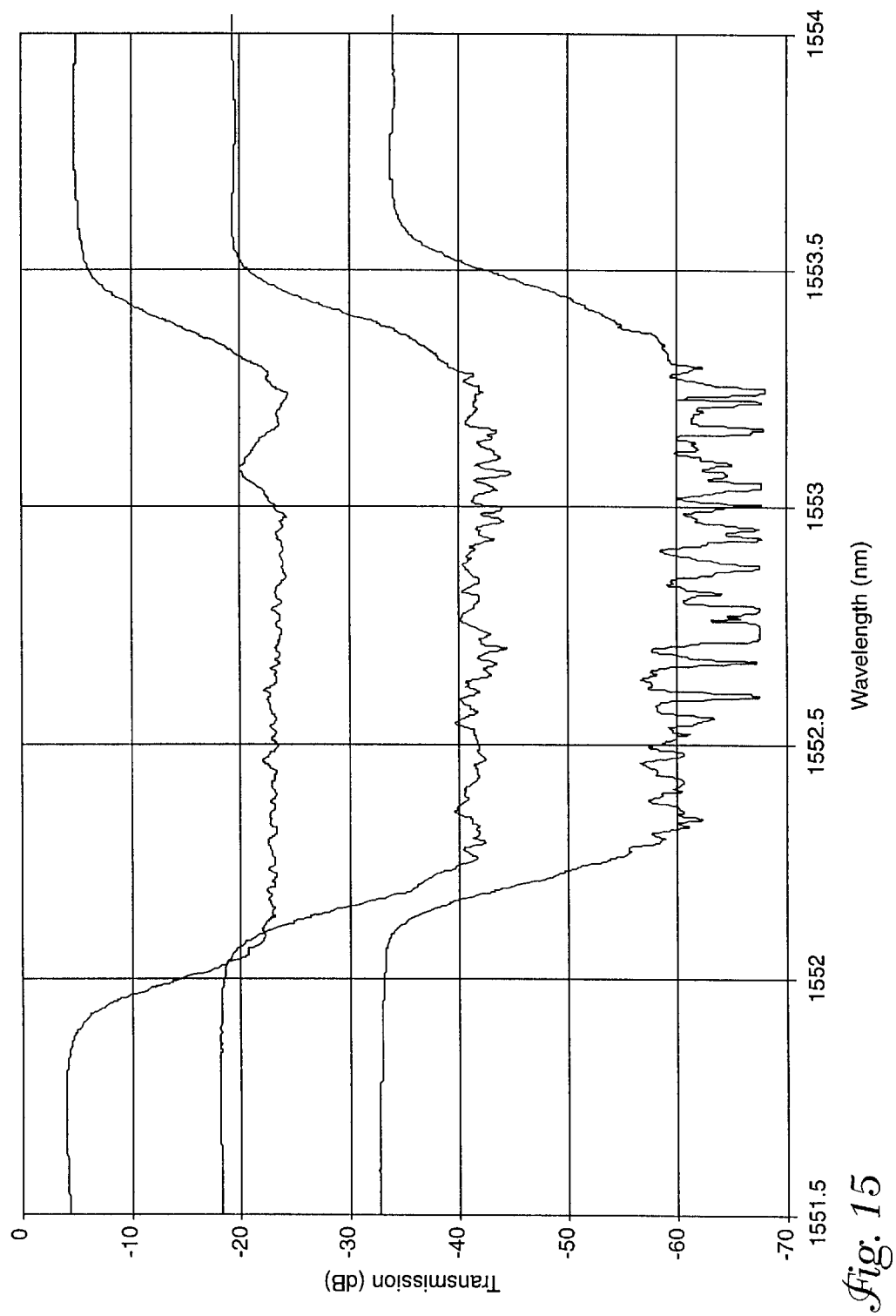
FIG. 15 shows a grating transmission spectrum written in optical glass fibers deposited with diamond-like network thin films as prepared in example 4.
Figure 16:
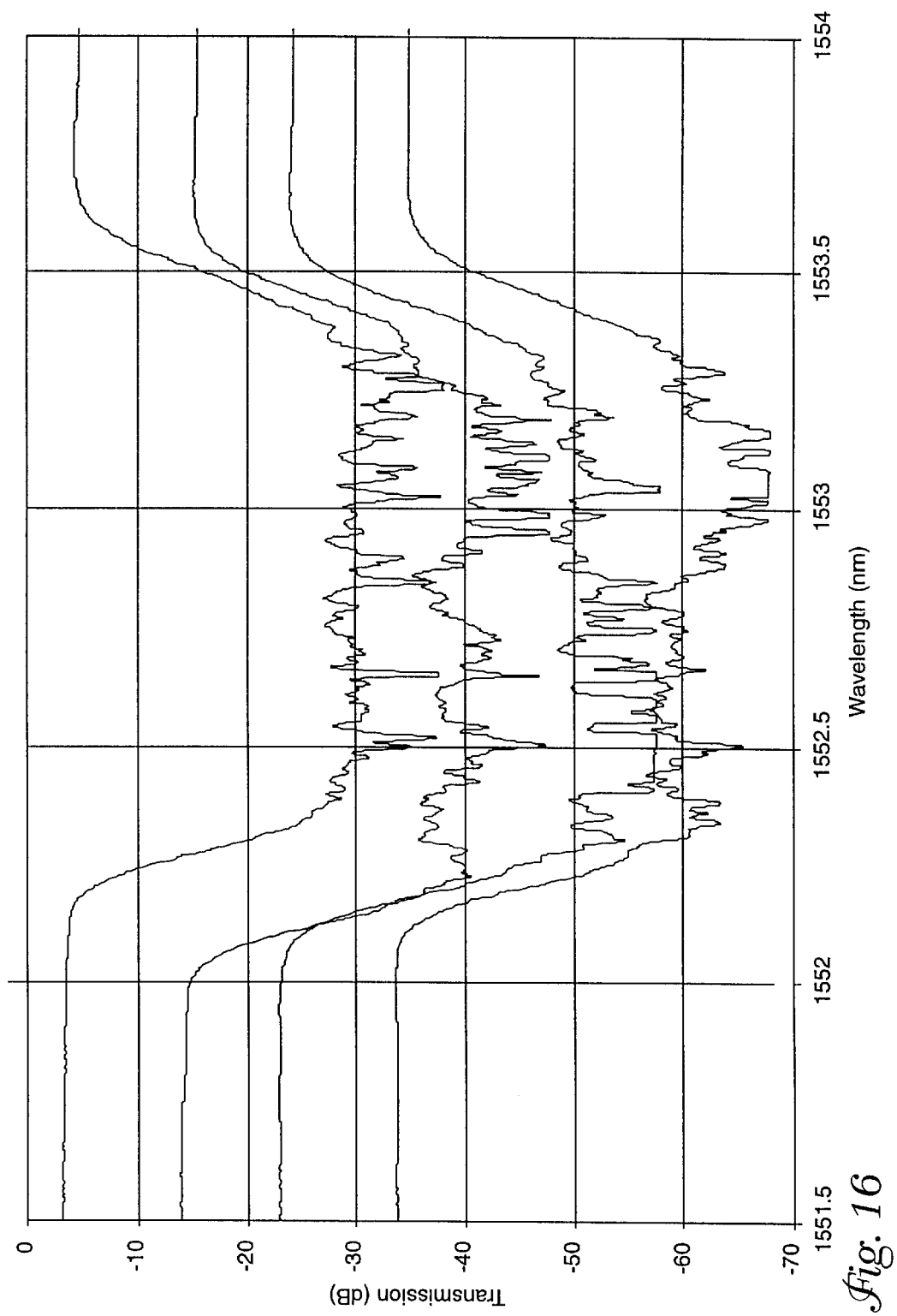
FIG. 16 shows grating spectra of long gratings written in optical glass fibers deposited with diamond-like glass thin films as prepared in example 5.

The composition of the DLN thin film was estimated from XPS analysis. On a hydrogen-free basis, the composition was 63 atomic percent carbon and 37 atomic percent fluorine as measured by the XPS technique of Example 2. The transmission of the DLN thin film of Example 4 was similar to that of Example 3 because the color was similarly brown. The DLN thin film of Example 4 was weaker than that of Example 1 because DLN could not be applied as thickly as DLG and retain comparable transparency. The Weibull plot for Example 4 is shown in FIG. 14.

The Bragg grating writing for Example 4 would be expected to be similar to that of Example 3 because of similar transparency and strength.

EXAMPLE 5

This example illustrates the write-through characteristics of DLG with a TMS to oxygen ratio of 1.5 on a long grating.

Example 5 was made in a manner similar to Example 2 except the optical fiber was different, the fiber cleaning process was changed, and the gratings were written by a different process. Acrylate-coated optical fibers having a germanium doped optical core including, with a nominal core diameter of 5 to 15 μm, a cladding diameter of 125 μm, and an acrylate coating diameter of 250 μm, (available as Part No. CS-96-0110 from 3M Company—Optical Transport Systems, West Haven, Conn.) were used that were about 762 mm (30 inches) long. They were soaked in an acetone bath for 30 to 60 minutes. The acrylate coating was then mechanically removed by reverse threading a Micro-Strip (available from Micro Electronics, Inc., Seekonk, Mass.) stripping tool with 0.15 mm (0.006 inches) cutting blades, squeezing the handle, and pulling the fiber through the tool. The fibers were then wiped three times with isopropanol moistened wipes (available as Kimwipes from Kimberly-Clark Corporation, Roswell, Ga.) to remove any remaining residue. After cleaning, the fibers were mounted, processed and tested as in Example 2, except the gratings were written using a frequency doubled argon ion laser (Model SABRE-FRED, Coherent Laser, Santa Clara, Calif.) using the TEM)) beam with beam power at 55 m Watts. The beam was focused through an interferometer to a spot size of 50 μm by 100 μm. The written gratings were 15 inches (about 38 cm) long.

Figure 13:
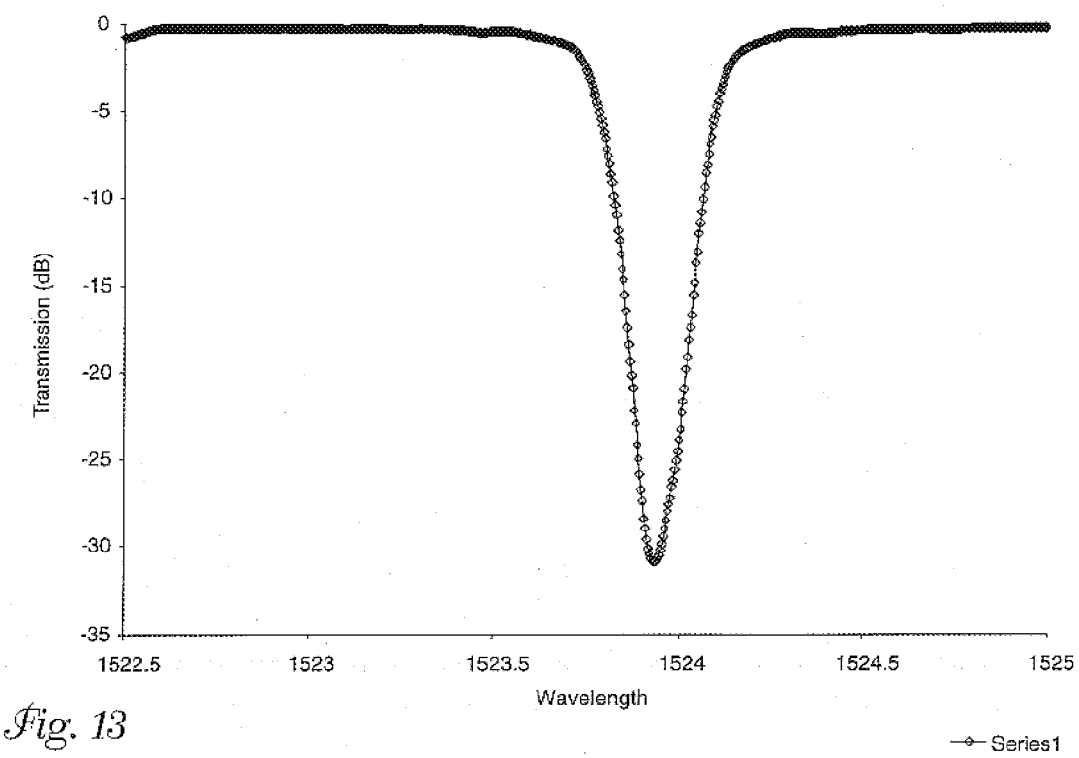
FIG. 13 is a grating transmission spectrum written in optical glass fibers deposited with diamond-like carbon thin films as prepared in example 3.

The Bragg grating writing for Example 5 was also satisfactory for long gratings. FIG. 13 depicts the grating transmission spectrum of the long grating for fiber with the DLG thin film deposited on its surface. FIG. 14 illustrates the transmission spectrum of the long grating without the DLG film. Within the range of experimental error, there is no difference between the gratings written in bare, mechanically stripped fibers and the gratings written through mechanically stripped and DLG encapsulated fibers.

EXAMPLE 6

This example illustrates the mechanical strength characteristics of gratings written through a DLG film, having a TMS to oxygen ratio of 1.5, on a 10 cm long grating.

Figure 17:
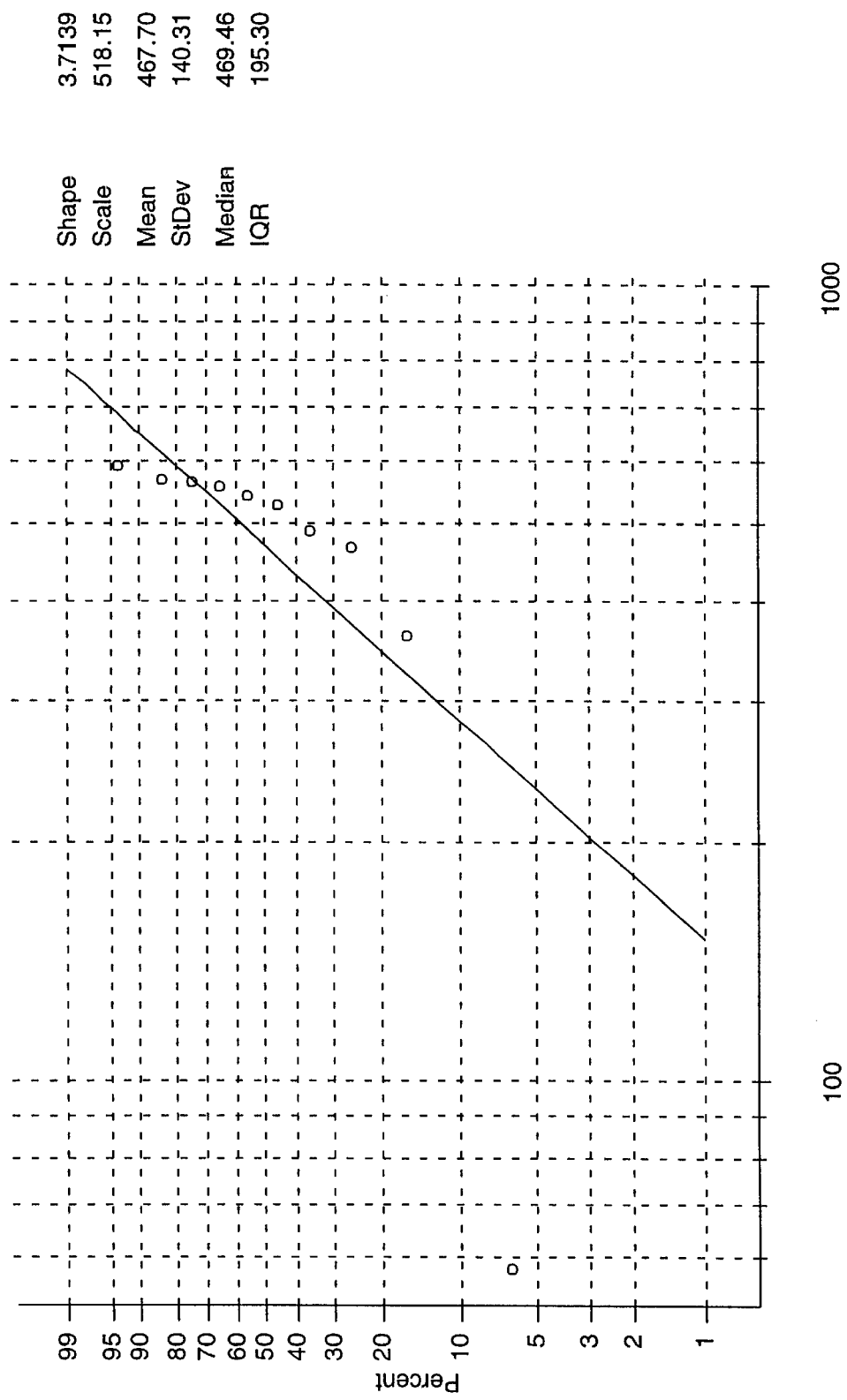
FIG. 17 is a Weibull plot of gratings that have been written through diamond-like glass thin films as prepared in example 6.

The acid stripping and DLG thin film deposition for Example 6 were performed in a manner similar to Example 2 except the acrylate coating was stripped over a 19 cm length instead of 6 cm and this entire stripped area was covered by the DLG thin film. Subsequent to DLG deposition, the fibers were wrapped on aluminum mandrels having a diameter of two inches and were hydrogen loaded in the same manner as Example 1. 10 cm long gratings were written through the DLG films in the same manner as in Example 5 and the mechanical strength of the gratings was measured using the same test procedure as in Example 1. A Weibull plot for the gratings is shown in FIG. 17. A total of ten gratings were pull tested. Of these, nine of the gratings had a strength exceeding 350 kpsi and six had a strength exceeding 500 kpsi. The Weibull mean strength of the ten gratings was 467.7 kpsi. Excluding the one grating that had a strength below 100 kpsi, the Weibull mean strength was 525.24 kpsi, which is a high value for gratings of that length.

Having now described the features, discoveries and principles of the invention, the manner in which the process and apparatus is constructed and used, the characteristics of the construction, and the advantageous, new and useful results obtained, the new and useful structures, devices, elements, arrangements, parts, and combinations, are set forth in the appended claims.

What is claimed is:

1. A glass article comprising:
    a glass substrate capable of demonstrating a change in refractive index upon exposure to actinic radiation, and
    a diamond-like film comprised of a covalently bonded random system, the diamond-like film being deposited on at a least a portion of the substrate,
    wherein the diamond-like film is at least about 50 percent transmissive to radiation at one or more wavelengths from about 180 to about 800 nanometers.

2. The glass article of claim 1, wherein the film comprises at least about 25 atomic percent carbon, from about 0 to about 50 atomic percent silicon, and from about 0 to 50 about atomic percent oxygen on a hydrogen-free basis.

3. The glass article of claim 1, wherein the film comprises from about 30 to about 70 atomic percent carbon, from about 20 to about 40 atomic percent silicon, and from about 20 to about 40 atomic percent oxygen on a hydrogen-free basis.

4. The glass article of claim 1, wherein the film comprises from about 30 to about 36 atomic percent carbon, from about 26 to about 32 atomic percent silicon, and from about 35 to about 41 atomic percent oxygen on a hydrogen-free basis.

5. The glass article of claim 1, wherein the film is at least about 70 percent transmissive to radiation at one or more wavelengths from about 180 to about 800 nanometers.

6. The glass article of claim 1, wherein the film is at least about 90 percent transmissive to radiation at one or more wavelengths from about 180 to about 800 nanometers.

7. The glass article of claim 1, wherein the film remains deposited on the substrate and is still transmissive to radiation after exposure to light from a frequency doubled Argon ion laser operating at beam power densities of 4000 W/cm$^2$ at a wavelength of 244 nm for one hour.

8. The glass article of claim 1, wherein the diamond-like film has an average thickness from about 1 to about 10 microns.

9. The glass article of claim 1, wherein the diamond-like film has an average thickness from about 0.01 to about 0.3 microns.

10. The glass article of claim 1, wherein the diamond-like film has an average thickness from about 0.1 to about 10 microns.

11. The glass article of claim 1, wherein the glass substrate is a recording medium.

12. The glass article of claim 1, wherein the,glass substrate is a waveguide.

13. The glass article of claim 12, wherein the waveguide is an optical fiber.

14. The optical fiber of claim 13, wherein samples of the fiber have a mean strength at 50 percent probability of failure when measured according to Standard Test Procedure FOTP-28 of at least about 200 kilopounds per square inch (1.38 Gpa).

15. The glass article of claim 1, wherein the diamond-like film is selected from the group of diamond-like carbon, diamond-like glass, and diamond-like.

16. A fiber optic Bragg grating comprising the article of claim 1.

17. A fiber optic Bragg grating according to claim 16, wherein the grating region is at least about 15 centimeters in length.

* * * * *

UNITED STATES PATENT AND TRADEMARK OFFICE
CERTIFICATE OF CORRECTION

PATENT NO. : 6,795,636 B1
APPLICATION NO. : 09/519447
DATED : September 21, 2004
INVENTOR(S) : Bryon J. Cronk It is certified that error appears in the above-identified patent and that said Letters Patent is hereby corrected as shown below:

Title Page,
Item [75] Inventors, delete "James Frances Brennan, III, Austin, TX (US)"

Item [56] References Cited, under U.S. Patent Documents, please add the following references:

| | | |
|---|---|---|
| 4,438,154 | 3/1984 | Kato et al |
| 4,552,791 | 11/1985 | Hahn |
| 4,661,409 | 4/1987 | Kieser et al |
| 4,663,183 | 5/1987 | Ovshinsky et al |
| 4,698,256 | 10/1987 | Giglia et al |
| 4,749,588 | 6/1988 | Fukuda et al |
| 4,760,005 | 7/1988 | Pai |
| 4,777,090 | 10/1988 | Ovshinsky et al |
| 4,783,361 | 11/1988 | Ovshinsky et al |
| 4,812,344 | 3/1989 | Jaeger et al |
| 4,877,677 | 10/1989 | Hirochi et al |
| 4,960,643 | 10/1990 | Lemelson |
| 5,041,303 | 8/1991 | Wertheimer et al |
| 5,073,785 | 12/1991 | Jansen et al |
| 5,135,808 | 8/1992 | Kimock et al |
| 5,190,807 | 3/1993 | Kimock et al |
| 5,206,083 | 4/1993 | Raj et al |
| 5,268,217 | 12/1993 | Kimock et al |
| 5,273,788 | 12/1993 | Yu |
| 5,366,556 | 11/1994 | Prince et al |
| 5,403,902 | 4/1995 | Heilmann et al |
| 5,455,072 | 10/1995 | Bension et al |
| 5,618,619 | 4/1997 | Petrmichl et al |

Item [56] References Cited, under U.S. Patent Documents, please add the following references:

| | | |
|---|---|---|
| 5,679,413 | 10/1997 | Petrmichl et al |
| 5,888,594 | 3/1999 | David et al |
| 6,015,597 | 1/2000 | David |
| 6,046,758 | 4/2000 | Brown et al |
| 6,080,470 | 6/2000 | Dorfman |
| 6,083,313 | 7/2000 | Venkatraman et al |

UNITED STATES PATENT AND TRADEMARK OFFICE
CERTIFICATE OF CORRECTION

PATENT NO. : 6,795,636 B1
APPLICATION NO. : 09/519447
DATED : September 21, 2004
INVENTOR(S) : Bryon J. Cronk It is certified that error appears in the above-identified patent and that said Letters Patent is hereby corrected as shown below:

Title Page,
Item [56] References Cited, under Foreign Patent Documents, please add the following references:

| | | |
|---|---|---|
| EP | 0 267 679 B1 | 5/1988 |
| EP | 0 278 480 B2 | 8/1988 |
| EP | 0 280 215 B1 | 8/1988 |
| EP | 0 395 198 A2, A3 | 10/1990 |
| EP | 0 469 926 A1 | 2/1992 |
| EP | 0 598 361 A1 | 5/1994 |
| JP | 2-114650 | 4/1990 |
| JP | 5-110163 | 4/1993 |
| WO | 92/06843 | 4/1992 |
| WO | 95/24275 | 9/1995 |
| WO | 96/05942 | 2/1996 |
| WO | 96/39943 | 12/1996 |
| WO | 97/13263 | 4/1997 |
| WO | 99/10560 | 3/1999 |
| WO | 99/38034 | 7/1999 |
| WO | 00/47402 | 8/2000 |

Item [56] References Cited, under Other Publications, please add the following reference:
　　　　David et al., "Plasma Deposition and Etching of Diamond-Like Carbon Films," AIChE Journal, Vol. 37, No. 3, March, 1991, pp. 367-376.
　　　　Borges et al., "A Novel Technique for Diamond Film Deposition Using Surface Wave Discharges," Diamond and Related Materials, Vol. 4, 1995, pp. 149-154.
　　　　Mort et al., "Xerographic Applications of Plasma-Deposited Amorphous Tetrahedral Materials," Plasma Deposited Thin Films, CRC Press, Chapter 7, 1986, pp. 187-204.

Title Page,
Item [57] Abstract, Line 6, after "radiation" delete "•"

Column 3,
Line 14, delete "implementgations" and insert -- implementations -- therefor.

Column 5,
Line 22, delete "spectram" and insert -- spectrum -- therefor.

Column 12,
Line 3, delete "ore" and insert -- more -- therefor.

UNITED STATES PATENT AND TRADEMARK OFFICE
CERTIFICATE OF CORRECTION

PATENT NO. : 6,795,636 B1
APPLICATION NO. : 09/519447
DATED : September 21, 2004
INVENTOR(S) : Bryon J. Cronk It is certified that error appears in the above-identified patent and that said Letters Patent is hereby corrected as shown below:

<u>Column 13,</u>
Line 25, delete "selfbias" and insert -- self-bias -- therefor.

<u>Column 19,</u>
Line 40, after "TEM" delete "))".

<u>Column 20,</u>
Line 59, delete "the,glass" and insert -- the glass -- therefor.

<u>Column 21,</u>
Line 3, after the second occurrence of "diamond-like" insert -- network --.

Signed and Sealed this

Thirty-first Day of October, 2006

JON W. DUDAS
*Director of the United States Patent and Trademark Office*